United States Patent [19]
Litteral

[11] Patent Number: 5,271,953
[45] Date of Patent: * Dec. 21, 1993

[54] SYSTEM FOR PERFORMING WORK ON WORKPIECES

[75] Inventor: Mary O. Litteral, Kokomo, Ind.

[73] Assignee: Delco Electronics Corporation, Kokomo, Ind.

[*] Notice: The portion of the term of this patent subsequent to Aug. 31, 2010 has been disclaimed.

[21] Appl. No.: 810,820

[22] Filed: Dec. 19, 1991

Related U.S. Application Data

[63] Continuation-in-part of Ser. No. 660,761, Feb. 25, 1991, abandoned.

[51] Int. Cl.$^5$ .......................... B05D 5/12; B05C 13/02
[52] U.S. Cl. ........................................ 427/8; 427/96; 427/425; 118/669; 118/679; 118/697; 118/704; 118/319; 118/500
[58] Field of Search ................. 427/96, 425, 510, 558, 427/8; 118/669, 679, 697, 704, 319, 642, 500

[56] References Cited

U.S. PATENT DOCUMENTS

| | | | |
|---|---|---|---|
| 3,049,768 | 8/1962 | Powell | 22/93 |
| 3,530,571 | 9/1970 | Perry | 29/563 |
| 3,836,388 | 9/1974 | Fowler | 117/120 |
| 4,059,708 | 11/1977 | Heiss, Jr. et al. | 427/96 |
| 4,086,696 | 5/1978 | Ikuta | 29/627 |
| 4,254,163 | 3/1981 | Piazza | 427/96 |
| 4,287,226 | 9/1981 | Pirvics et al. | 427/54.1 |
| 4,424,252 | 1/1984 | Nativi | 428/209 |
| 4,503,596 | 3/1985 | Ida et al. | 29/568 |
| 4,508,758 | 4/1985 | Wong | 427/96 |
| 4,560,584 | 12/1985 | Henninger | 427/96 |
| 4,570,782 | 2/1986 | Cargill et al. | 198/345 |
| 4,623,559 | 11/1986 | Hudock | 427/54.1 |
| 4,661,368 | 4/1987 | Rohde et al. | 427/8 |
| 4,695,482 | 9/1987 | Weiswurm | 427/96 |
| 4,753,819 | 6/1988 | Shimada | 427/96 |
| 4,784,872 | 11/1988 | Moeller et al. | 427/96 |
| 4,826,705 | 5/1989 | Drain et al. | 427/54.1 |
| 4,830,922 | 5/1989 | Sparrowhawk et al. | 428/411.1 |
| 4,880,663 | 11/1989 | Shimada | 427/96 |
| 5,052,540 | 10/1991 | Matsuyama et al. | 198/346.1 |

FOREIGN PATENT DOCUMENTS 2507521 12/1982 France .
2635997 9/1990 France .

OTHER PUBLICATIONS

Litteral, application Ser. No. 07/661,565, filed Feb. 25, 1991.
European Search Report, EP 92 200377.7 dated 24 Nov. 1992.
Annex to European Search Report, EP 92 20 0377.7 dated 10 Nov. 1992.
Anonymous, "Surface Mount Integrated Circuit Conformal Coating Process," (Disclosure 30686), *Research Disclosure*, pp. 753-754 (Oct. 1989).
Sales Bulletin, "Series S5000 Selective Coating Systems," Integrated Technologies, Inc., P.O. Box 123, 70 Mill Road, Acushnet, Mass. 02743. (no date available).
Sales Bulletin, "Series CL7000 Modular Selective Conformal Coating & Drying Systems," Integrated Technologies, Inc., P.O. Box 123, 70 Mill Road, Acushnet, Mass. 02743. (no date available).
Sales Bulletin, "Nordson Select Coat System," (Brochure No. 306-18-857), copyright Nordson Corporation, 1989, Nordson Electronics Business Group, 555 Jackson Street, P.O. Box 151, Amherst, Ohio 44001. (Feb. 1989).

*Primary Examiner*—Shrive Beck
*Assistant Examiner*—Katherine A. Bareford
*Attorney, Agent, or Firm*—Cary W. Brooks

[57] ABSTRACT

Work is performed on workpieces, e.g., coating circuit boards, of different types in random order in assembly line fashion on a rotary table of an apparatus under programmed control. The table is rotated stepwise to move successive sections thereof from a load-unload station at which the respective workpieces are loaded and unloaded in random order, to a sensing station at which the type and orientation of the workpiece is sensed, next to a work station at which work is performed on the workpiece in dependence upon its type and orientation previously sensed at the sensing station, and in turn back to the load-unload station to complete a cycle. The workpiece is either changed in orientation on the table section for a repeat cycle to perform further work thereon or is replaced by another workpiece in random order.

43 Claims, 11 Drawing Sheets

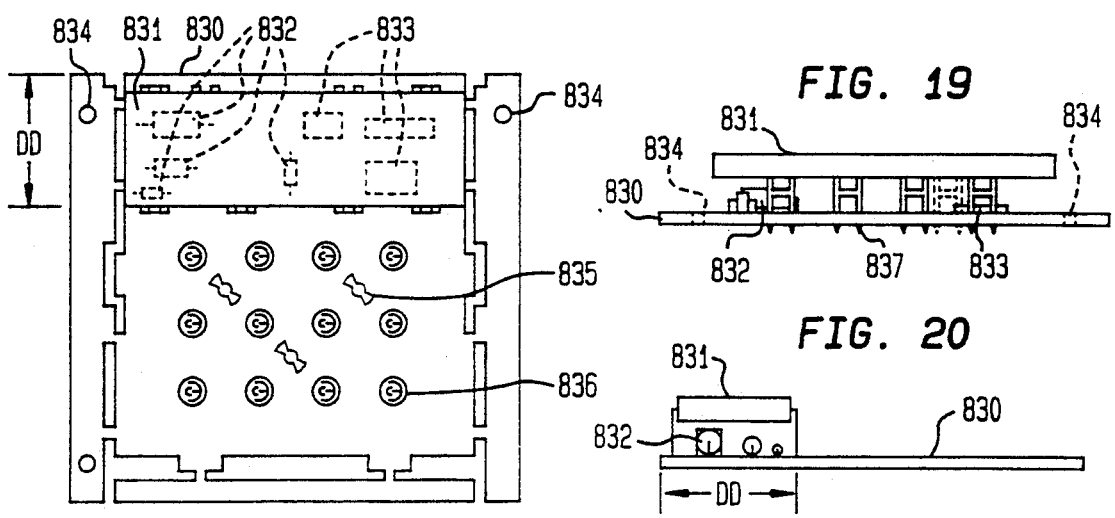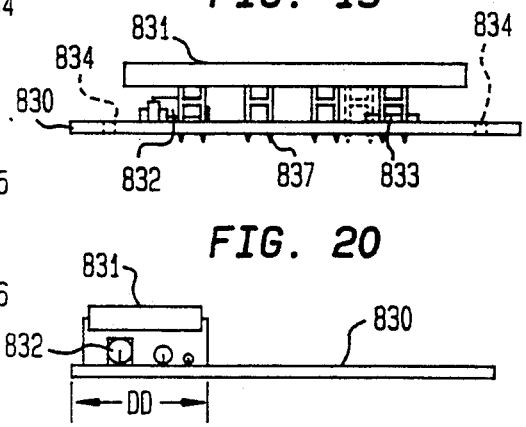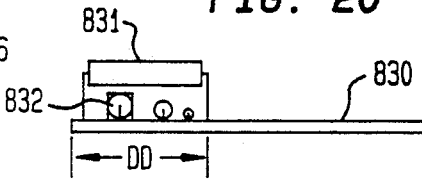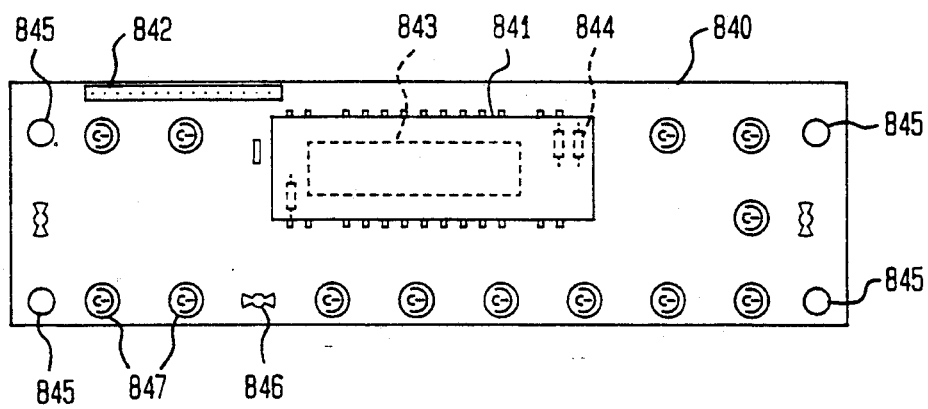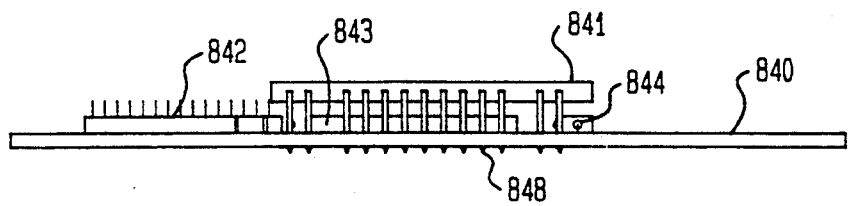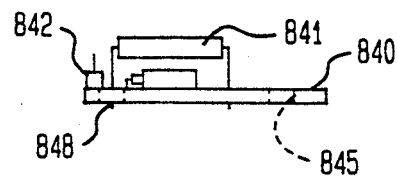

FOCUSED

SEMI-FOCUSED

DIFFUSED

SYSTEM FOR PERFORMING WORK ON WORKPIECES

CROSS REFERENCE TO RELATED APPLICATION

This is a continuation-in-part of U.S. Ser. No. 07/660,761 filed Feb. 25, 1991 now abandoned of which Applicant claim the benefit of the filing date, and of which the written disclosure is hereby incorporated by reference.

This application is related to applicant's copending U.S. application Ser. No. 07/661,565, filed Feb. 25, 1991, now abandoned, and commonly assigned, entitled "System For Performing Related Operations on Workpieces."

FIELD OF THE INVENTION

This invention relates to a system for performing work on workpieces and, more particularly, to an apparatus and method for applying coatings onto predetermined portions of circuit boards.

BACKGROUND OF THE INVENTION

In fabricating circuit boards, a coating is usually applied to certain portions thereof either to mask them temporarily during subsequent processing or to protect them permanently.

Temporary masking is typically effected by selectively coating the concerned portions of the circuit board with a maskant type coating material that is stripped from the board at a later fabrication stage. Permanent protection is typically effected by coating the concerned portions of the circuit board with a conformal type coating material that conforms to the surface configuration of the board to seal therewithin pertinent circuit components of various shapes and heights on the board that are to be protected. In both cases, the coating is usually subjected to curing to impart structural integrity thereto.

U.S. Pat. No. 4,254,163 (Piazza) shows a thermographic printing method for making a given type printed circuit on a metal clad substrate. Resin powder is dusted onto a pattern of non-dryable, hydrophobic and heat non-spreadable, liquid ink on the substrate, the powder adhering only to the ink. Heat fusing the powder to the ink forms a strippable mask which is stripped to form the circuit after etching the ink-free substrate areas.

U.S. Pat. No. 4,287,226 (Pirvics et al.) shows the curing of an ultraviolet (UV) light curable resin to form a protective coating on a given type circuit element-containing substrate. The resin is exposed to UV light through a silk screen having opaque areas that mask the UV light from corresponding areas of the resin that are not to be cured. Assumably, the non-cured resin areas of the coating are thereafter stripped.

U.S. Pat. No. 4,826,705 (Drain et al.) shows the mechanical stripping of a laminated portion of a conventionally cured conformal coating and underlying ultraviolet light cured temporary mask that cover an edge connection area on a given type printed circuit board, thereby exposing the area. The cured mask is readily stripped in one piece in the manner of adhesive tape.

U.S. Pat. No. 4,830,922 (Sparrowhawk et al.) shows use of a solvent removable coating of glass microspheres in a grease as a temporary protective conformal coating for selective components of various shapes and heights on a given type circuit board.

U.S. Pat. No. 4,623,559 (Hudock) shows an assembly line conveyor for dipping a given type thermistor in a bath of ultraviolet (uv) light curable coating material, and then passing each thermistor under uv light to cure the coating.

U.S. Pat. No. 4,695,482 (Weiswurm) shows an assembly line conveyor for programmed top and bottom side coating and curing of two different types of circuit boards horizontally clipped thereto. At a sole station, a sensor stops the conveyor on sensing a board, and the appropriate one of two identifiers determines the type board sensed. This causes the appropriate one of two types of upper nozzle sets to descend to the board for selectively spray coating its top side. At the same time, its bottom side is grossly coated by an underlying wave coating unit. The nozzle set is then raised and the conveyor restarted for sensing and spraying the next board in time-consuming sequential tandem steps at the sole station. The coated boards continue on the conveyor for intermittent travel through an oven for curing.

U.S. Pat. No. 3,836,388 (Fowler) shows a manually operated batch apparatus for applying a silicone rubber coating on a given type circuit-containing substrate, in sets of four substrates at a time. Each set of coated substrates is then transferred by the operator to the next available one of a plurality of cam actuated vacuum degassing chambers on an adjacent manually operated rotary table (dial), after the operator removes a previously degassed set of coated substrates from that chamber for curing elsewhere.

U.S. Pat. No. 4,661,368 (Rohde et al.) shows a program controlled spray nozzle movable to apply adhesive dots to a given type circuit board for holding later added components.

U.S. Pat. No. 4,560,584 (Henninger) shows a program controlled spray nozzle movable to apply individual dots of liquid solder resist material onto selected portions of a given type circuit board to mask such portions and prevent them from being coated in a subsequent wave soldering step. The resist material is then removed in a cleaning step.

U.S. Pat. Nos. 4,753,819 and 4,880,663 (Shimada) commonly show a program controlled spray nozzle movable to apply a flowable, e.g., conformal, coating material selectively onto predetermined portions of a circuit board having circuit components of various shapes and heights. Airless spraying technique is used to coat such portions without overspraying onto adjacent board portions not intended to be coated.

Nordson Corporation (Nordson Electronics Business Group, Amherst, Ohio), Product Data Sheet 306-18-857, issued February 1989, shows a local or an in-line, program controlled, spray nozzle conformal coating system for selectively coating a given type circuit board by a robotic unit available in 4-axis and 5-axis configurations.

Integrated Technologies, Inc. (Acushnet, Mass.), Product Data Sheets, Series S5000 and CL7000, also show program controlled spray nozzle conformal coating systems for selectively coating a given type circuit board by robotic units.

None of these prior art teachings involves the uninterrupted performing of respective sequential operations simultaneously at successive stations of a multiple station assembly line, selectively on randomly differing types of workpieces in individually differing orientation, respectively at the stations.

It is desirable to provide a system for performing work on workpieces of different types in random order in assembly line fashion, wherein the system is flexible in that it enables work to be performed selectively on each workpiece, regardless of its type, orientation or assembly line order, without interrupting on-line processing to adjust the system to each type workpiece.

SUMMARY OF THE INVENTION

In accordance with the present invention, a system is provided for performing work on workpieces of different types in random order in assembly line fashion. The system contemplates an apparatus and method for performing the work, such as the selective masking or conformal coating of flowable coating material onto predetermined portions of circuit boards. The system is flexible in that the work is performed "in line," i.e., without interrupting the assembly line operation to adjust it to each of the individual types of workpieces or their individually differing orientation, even though they vary randomly in order.

The apparatus in accordance with the invention contemplates a rotary table comprising circumferentially spaced-apart table sections, and having rotating means for rotating the table stepwise to move each section in cycles successively at selective intervals at a load-unload station to a sensing station, next to a work station and in turn back to the load-unload station.

A plurality of at least two different types of carriers are receivable in random order respectively on the table sections. Each type carrier is distinctive for carrying an associated type of workpiece different from that of each of the other types of carriers, and has holder means for holding its associated type workpiece in at least two different alternative orientations to perform work on respectively predetermined portions thereof in each orientation.

Sensing means are provided for sensing the type and orientation of a workpiece held on a carrier on a respective table section at the sensing station, and work performing means are provided to perform work selectively on such predetermined portions of a workpiece held in a given said orientation on a respective section at the work station. The work performing means are operated in dependence upon the workpiece type and orientation previously sensed at the sensing station.

Control means are used for controlling the rotating means, sensing means and work performing means for selective interval stepwise operation, to permit loading and unloading of the carriers in random order respectively onto and from the table sections at the load-unload station, workpiece type and orientation sensing at the sensing station, and predetermined portion workpiece work performing at the work station, between stepwise movements of the sections.

Each table section suitably has receiving means to receive a respective carrier thereon. Indicator means may be associated with each carrier to indicate the associated type workpiece, the indicator means being arranged for sensing by the sensing means when the carrier is on a section at the sensing station.

Each carrier holder means may comprise a first holder to hold an associated type workpiece in a first orientation for performing work on predetermined first portions thereof, and a second holder to hold an associated type workpiece in a second orientation for performing work on predetermined second portions thereof. The first holder may be arranged to hold the workpiece such that a portion thereof occupies a first region relative to the carrier, and the second holder may be arranged to hold the workpiece such that a portion thereof occupies a second region relative to the carrier which is distinct from the first region.

The sensing means may comprise signal beam projecting means for projecting a first beam along a first sensing path intersecting the first region when the workpiece is in the given said first orientation on the carrier on a table section at the sensing station, and for projecting a second beam along a second sensing path intersecting the second region when the workpiece is in a given said second orientation on the carrier thereat. In this way, a workpiece in a said orientation on an associated carrier at the sensing station interrupts the corresponding beam for sensing its orientation.

The work performing means may include dispensing means comprising a movable nozzle to dispense a flow of coating material, and moving means. The moving means move the nozzle along a first predetermined coating path to coat the dispensed coating material selectively onto predetermined first portions of a workpiece in a first said orientation on an associated carrier on a table section at the work station, and alternatively along a second predetermined coating path to coat the dispensed coating material selectively onto predetermined second portions of the workpiece in a second said orientation on the carrier on a table section at the work station, in dependence upon the workpiece type and orientation previously sensed at the sensing station.

The control means control the dispensing means and moving means for selective interval stepwise operation to permit predetermined portion workpiece coating at the work station, between stepwise movements of the table sections.

Typically, the workpieces are circuit boards each having first and second sides, and each holder is arranged to hold an associated type circuit board in a first orientation such that the first side of the circuit board is exposed for selectively coating predetermined first portions thereof, and alternatively in a second orientation such that its second side is exposed for selectively coating predetermined second portions thereof.

The moving means are arranged to move the nozzle in a generally horizontal linear first direction, in a generally horizontal linear second direction crosswise of the first direction, and in a generally vertical linear third direction. The moving means desirably also move the nozzle in a rotational fourth direction about a generally vertical axis and in a rotational fifth direction about a generally horizontal axis.

The apparatus of the invention favorably contemplates automatic operation. Specifically, the control means are arranged to control the rotating means, sensing means and work performing means for selective interval stepwise automatic operation, to permit loading and unloading of the carriers in random order respectively onto and from the table sections at the load-unload station, automatic workpiece type and orientation sensing at the sensing station, and automatic predetermined portion workpiece work performing at the work station, between automatic stepwise movements of the table sections.

The method in accordance with the invention contemplates performing work on workpieces of different types in random order in assembly line fashion, by a series of related steps.

These include rotating the table stepwise at selective intervals to move each section stepwise in cycles successively from the load-unload station to the sensing station, next to the work station and in turn back to the load-unload station, and providing the plurality of different types of carriers, each distinctive for carrying its type workpiece and capable of holding such a workpiece in at least two different alternative orientations to perform work on respectively predetermined portions thereof in each orientation, as well as providing such a workpiece on each carrier in a said orientation.

Then, the following steps are carried out therewith, between stepwise movements of the table sections:

(1) loading in random order a carrier holding an associated type workpiece in a said orientation onto each section, on stepwise movement of the respective section to the load-unload station, (2) sensing the type and orientation of the workpiece, on stepwise movement of the respective section to the sensing station, (3) performing work selectively on said predetermined portions of the workpiece in the said orientation, on stepwise movement of the respective section to the work station, the work being performed in dependence upon the type and orientation of the workpiece previously sensed at the sensing station, (4) selectively either changing the workpiece from the said orientation to another said orientation on the associated carrier, or alternatively unloading such carrier and loading in random order another carrier holding an associated type workpiece in a said orientation, on stepwise movement of the respective section to the load-unload station to complete a cycle, and (5) repeating said steps sufficiently to complete at least one further cycle.

Desirably, the steps are effected such that at least one of the cycles includes the selective step of changing of a workpiece from the said orientation to another said orientation on an associated carrier, and the repeating of the steps sufficiently to complete at least one further cycle.

The step of performing work advantageously comprises coating a flowable coating material selectively onto such predetermined portions of the workpiece in the given said orientation. Thus, where the workpieces have first and second sides, each workpiece may be held on the associated carrier either in a first orientation such that the first side of the workpiece is exposed for selectively coating predetermined first portions thereof, or alternatively in a second orientation such that the second side thereof is exposed for selectively coating predetermined second portions thereof.

In particular, the workpieces comprise circuit boards each having a different pattern of circuit components on its first and second sides. The coating material may be a masking material for masking selectively circuit components on a corresponding side of the circuit board, or a conformal coating material for sealing the circuit components on a corresponding side thereof. The workpieces typically have opposed first and second sides, and the selective step of changing the workpiece from the said orientation to another said orientation is effected by turning over the workpiece to expose its other corresponding side.

Typically, carrier loading and the step of selectively either changing the workpiece or alternatively unloading such carrier are effected manually, and the steps of sensing the workpiece type and orientation, performing work on the predetermined portions of the workpiece, and rotating the table stepwise at selective intervals, are effected automatically.

The table conveniently comprises four sections and is rotated to move each section stepwise successively from the load-unload station to the sensing station, next to the work station, then to a counterpart load-unload station and in turn back to the load-unload station. Carrier loading is effected at the load-unload station, workpiece sensing is effected at the sensing station, and performing of work on the workpieces is effected at the work station. On the other hand, the selective step of changing the workpieces from one orientation to another is effected selectively either at the load-unload station or alternatively at the counterpart load-unload station, and the selective step of unloading the carriers is effected at the counterpart load-unload station.

According to a further method embodiment, a carrier holding an associated type workpiece in a said orientation is provided on each table section, for said steps of sensing and performing work, after which the workpiece is selectively either changed to another said orientation on the same carrier, or alternatively unloaded and another associated type workpiece loaded on the same carrier in a said orientation thereon. The steps may be effected such that at least one of the cycles includes the selective step of changing a first workpiece from the said (first) orientation to another (second) said orientation on an associated carrier, and the further step of loading on the same carrier a second associated type workpiece in the said (first) orientation thereon, and the repeating of the steps sufficiently to complete at least one further cycle in which the type and orientation of each said workpiece are sensed and work is performed on both said workpieces in dependence upon such sensing.

The invention will be better understood from the following more detailed description taken with the accompanying drawings.

BRIEF DESCRIPTION OF THE DRAWINGS

FIG. 18 is a top view of a sixth type workpiece usable in the apparatus of FIG. 1;

FIG. 19 is an elevational view of the workpiece of FIG. 18;

FIG. 20 is a side view of the workpiece of FIG. 18;

FIG. 21 is a top view of a seventh type workpiece usable in the apparatus of FIG. 1;

FIG. 22 is an elevational view of the workpiece of FIG. 21;

FIG. 23 is a side view of the workpiece of FIG. 21;

It is to be noted that the drawings are not to scale, some portions being exaggerated to make them easier to understand.

DETAILED DESCRIPTION

Figure 1:
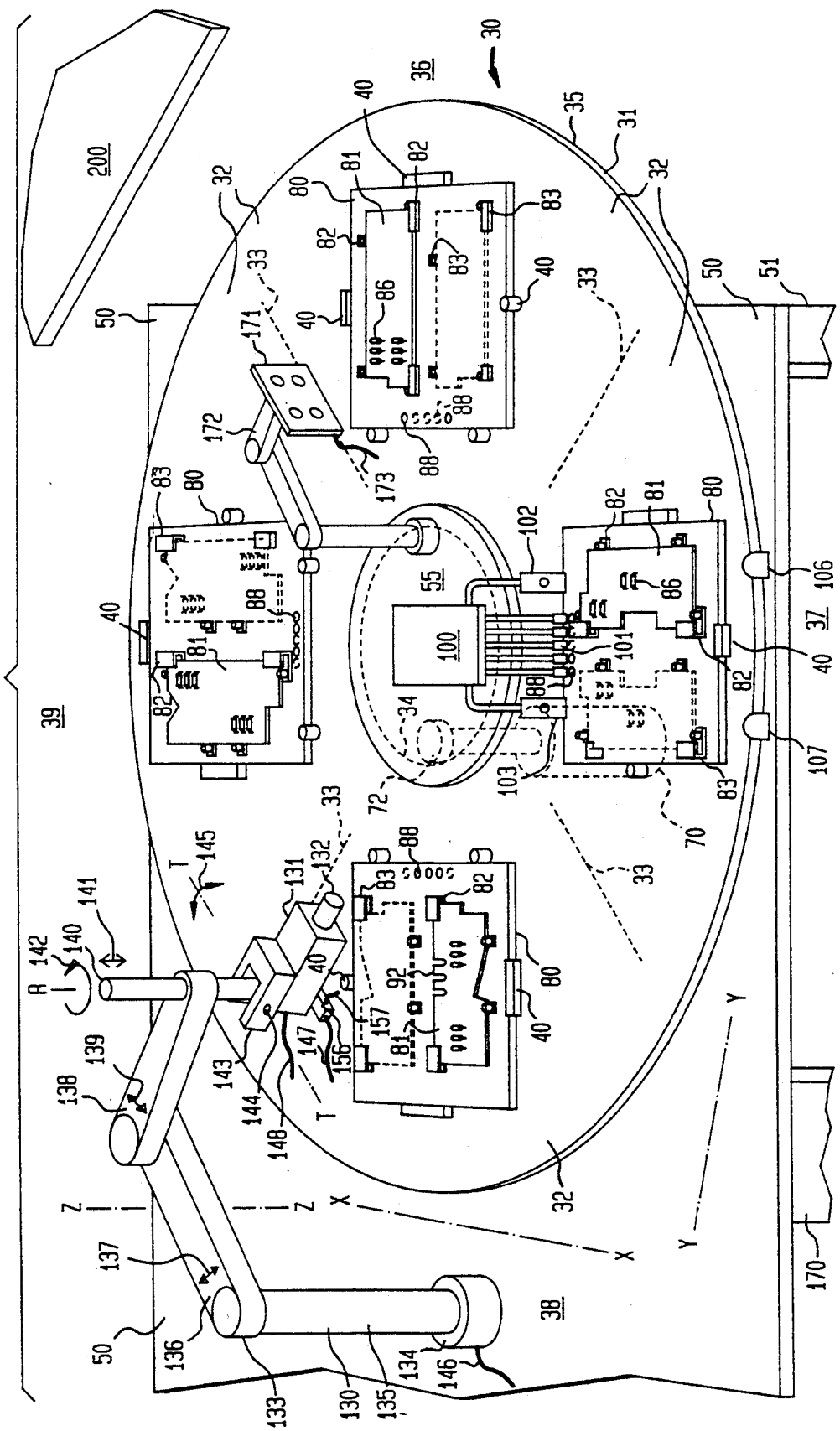
FIG. 1 is a perspective view of an apparatus according to the invention, showing a rotary table with four different types of workpieces held by carriers received on respective table sections at the load-unload station for sensing at the sensing station and undergoing work at the work station.

FIG. 1 is a perspective view of an apparatus 30 according to the invention, with a rotary table 31 having four table sections 32 whose receiving means 40 respectively receive four different types of carriers 80 correspondingly holding four different types of workpieces 81. Table 31 is mounted on a support 50 for rotation by a motor 70 as rotating means to move the sections 32 from a load-unload station 36 to a sensing station 37 for sensing by sensing means 100, next to a work station 38 for performing work on the workpieces 81 by work performing means 130 formed of a coating material spray gun 131 and moving means 133, then to a counterpart load-unload station 39, and back to the load-unload station 36, under control of control means 170.

Figure 2:
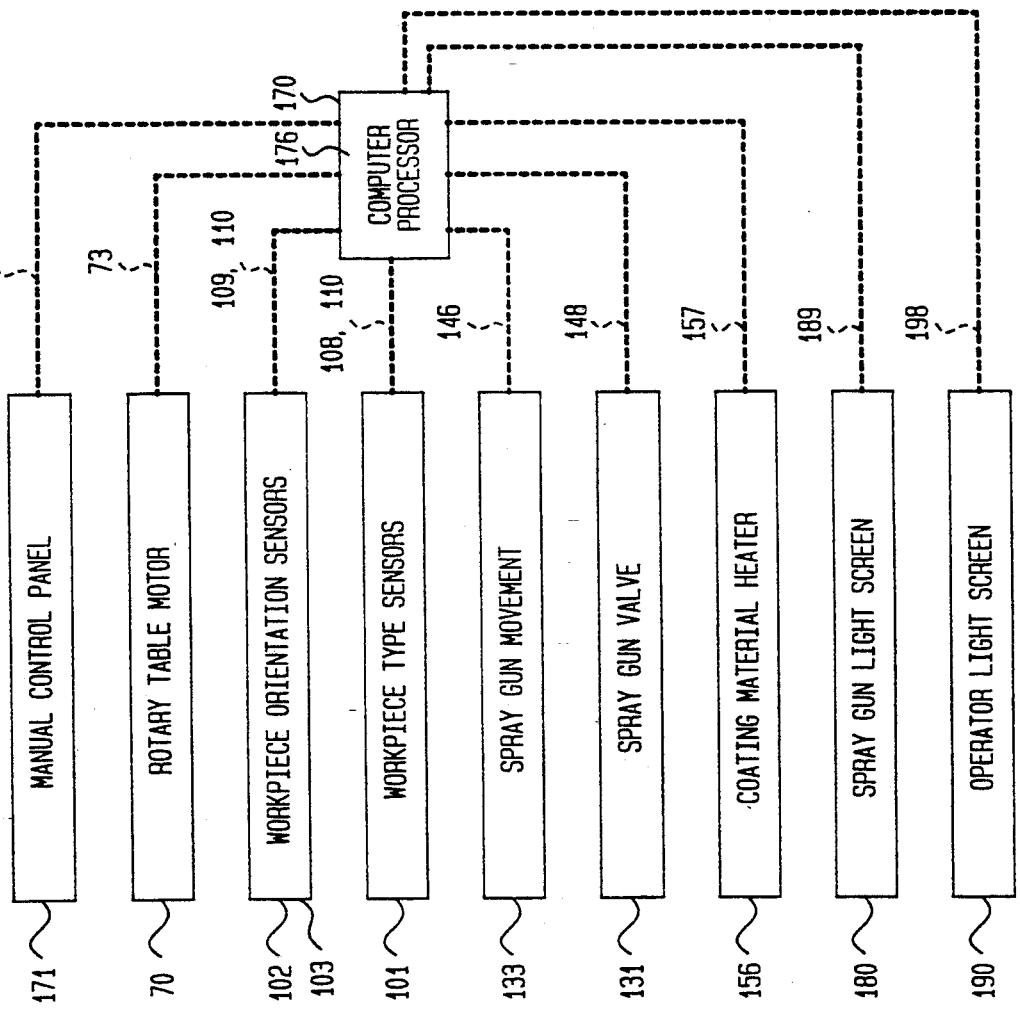
FIG. 2 is a schematic view of control means for operating the apparatus of FIG. 1.
Figure 3:
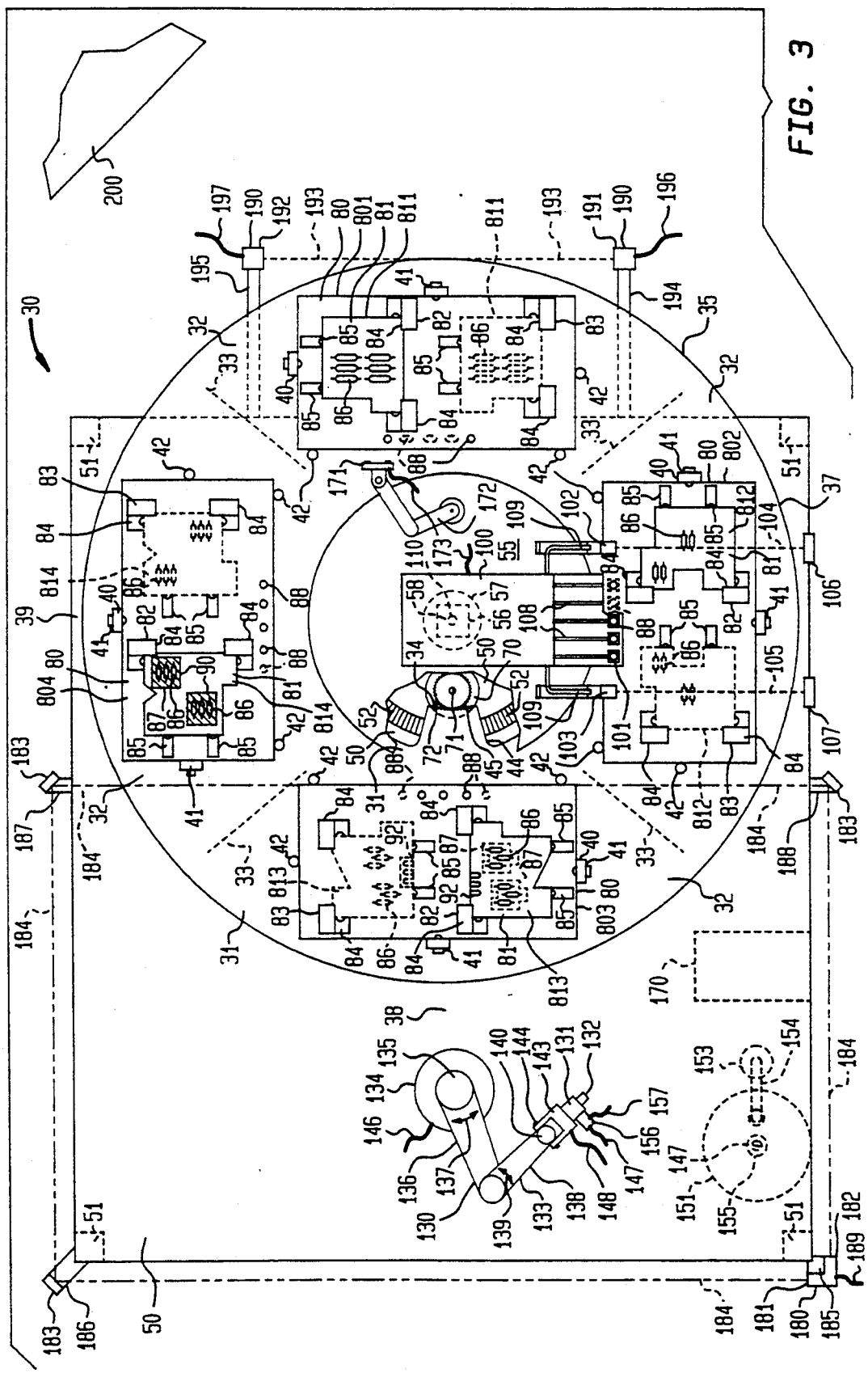
FIG. 3 is a top view of the apparatus of FIG. 1.
Figure 4:
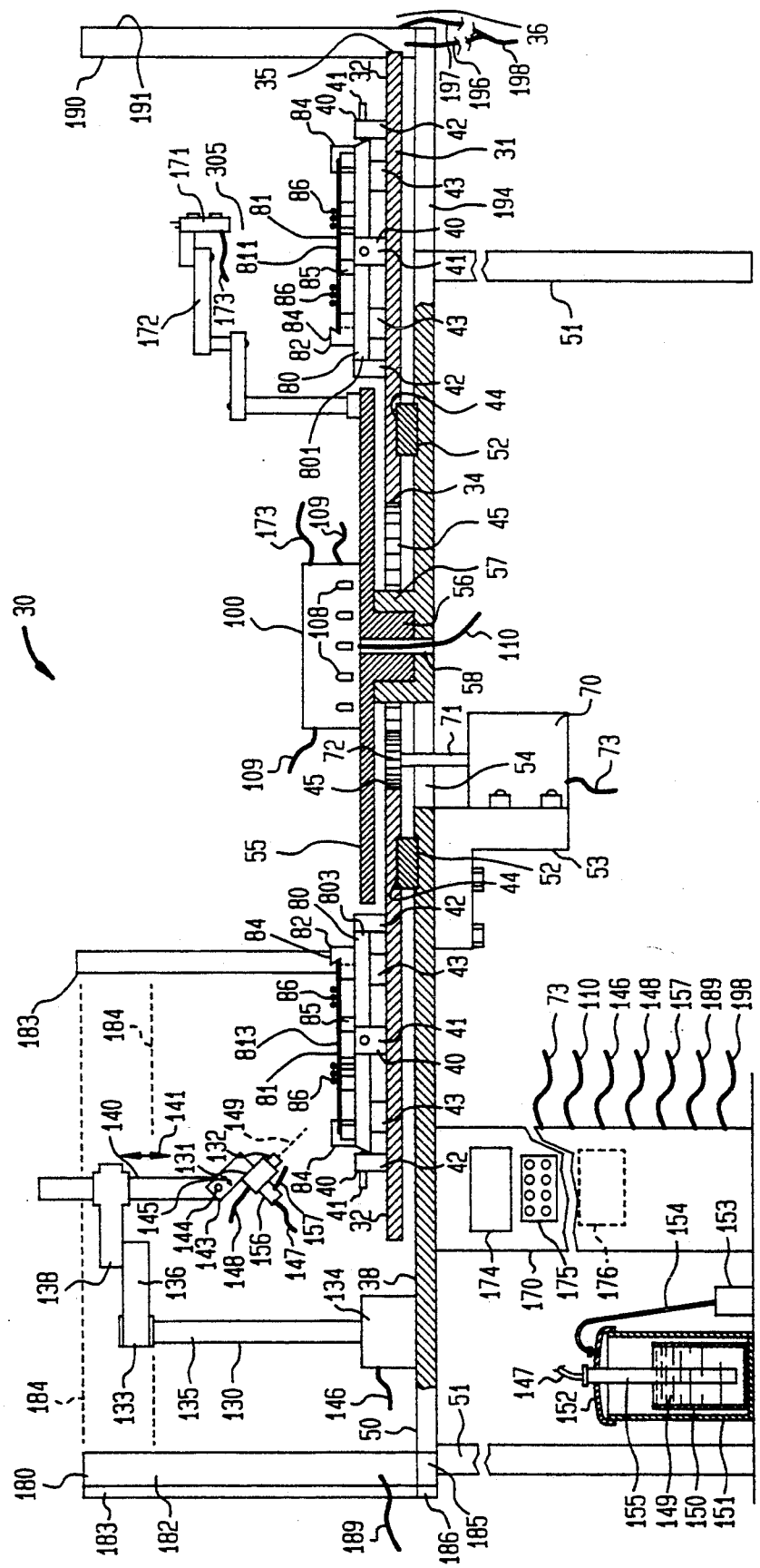
FIG. 4 is a side view, partially in section, of the apparatus as shown in FIG. 3.

FIG. 2 is a diagram of control means 170 showing a computer processor 176 connected to a manual control panel 171, the motor 70, workpiece orientation sensors 102 and 103, workpiece type sensors 101, moving means 133, the valve (not shown) of the spray gun 131, a coating material heater 156, spray gun light screen means 180 and operator light screen means 190. FIGS. 3 and 4 are top and side views, respectively, of apparatus 30.

Figure 6:
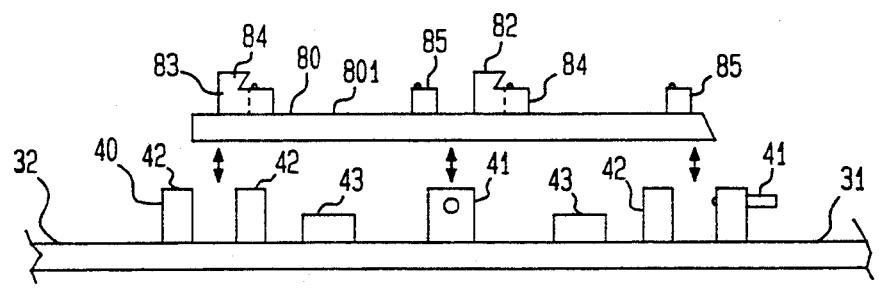
FIG. 6 is an exploded view showing the manner of loading and unloading a carrier onto and from a table section at the load-unload station as indicated in FIG. 5.
Figure 7:
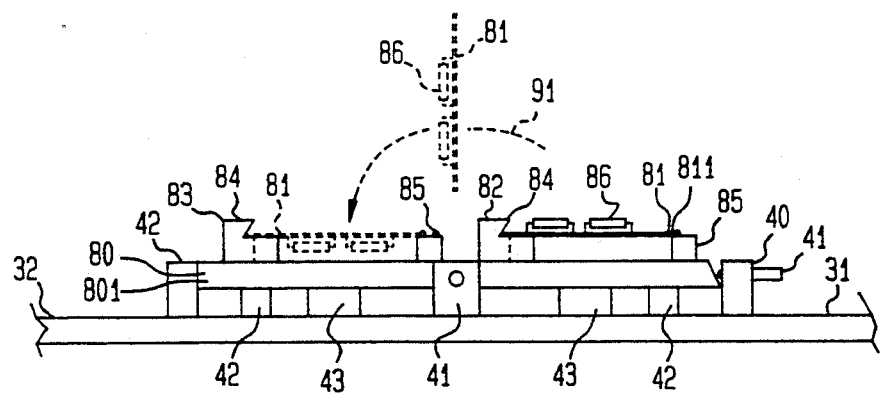
FIG. 7 is an elevational view showing the manner of changing the orientation of a workpiece on a carrier at the load-unload station as indicated in FIG. 5.
Figure 5:
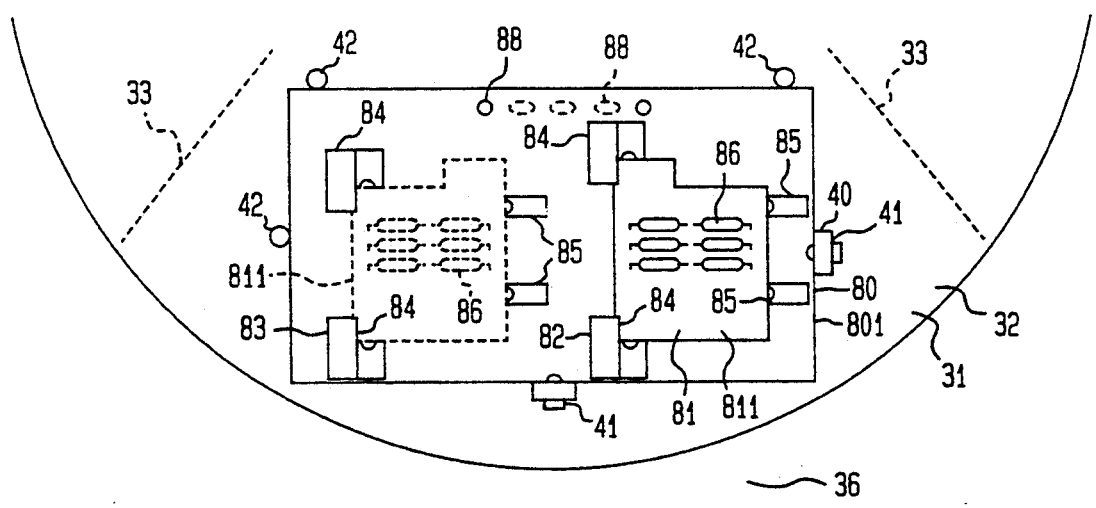
FIG. 5 is a top view of the portion of the apparatus of FIG. 3 at the load-unload station showing a first type workpiece.
Figure 9:
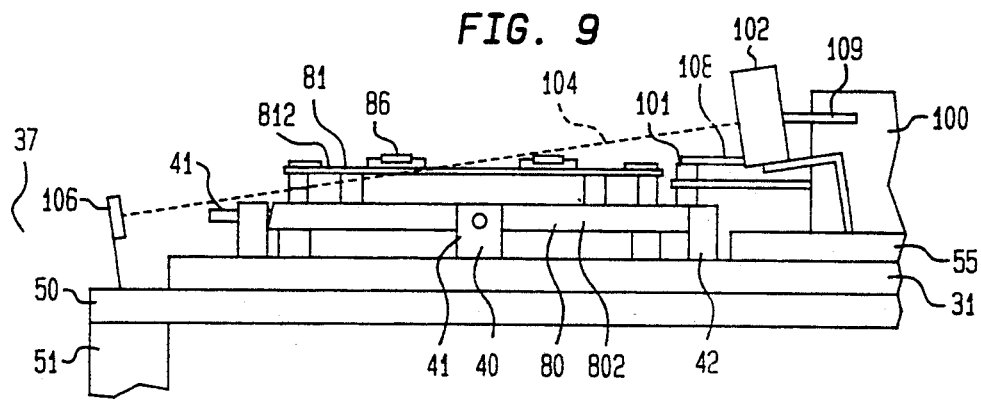
FIG. 9 is a side view showing the manner of sensing a workpiece at the sensing station as indicated in FIG. 8.
Figure 10:
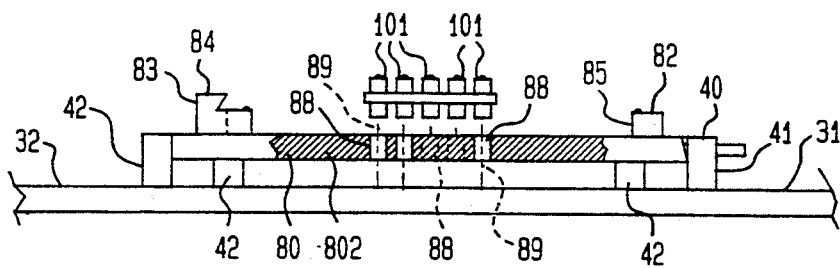
FIG. 10 is an elevational view, partially in section, showing details at the sensing station as indicated in FIG. 8.
Figure 8:
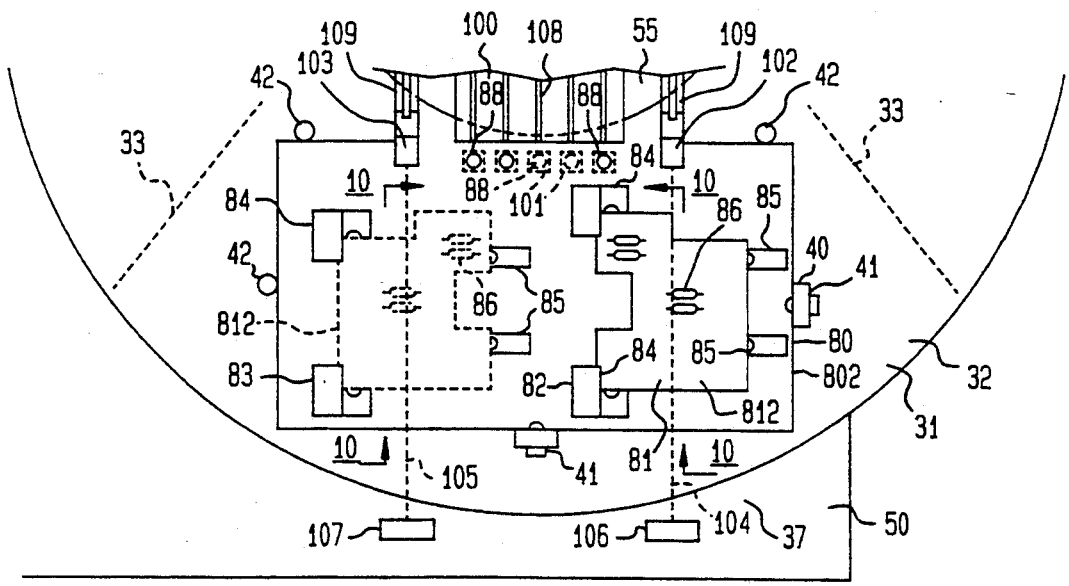
FIG. 8 is a top view of the portion of the apparatus of FIG. 3 at the sensing station showing a second type workpiece.
Figure 12:
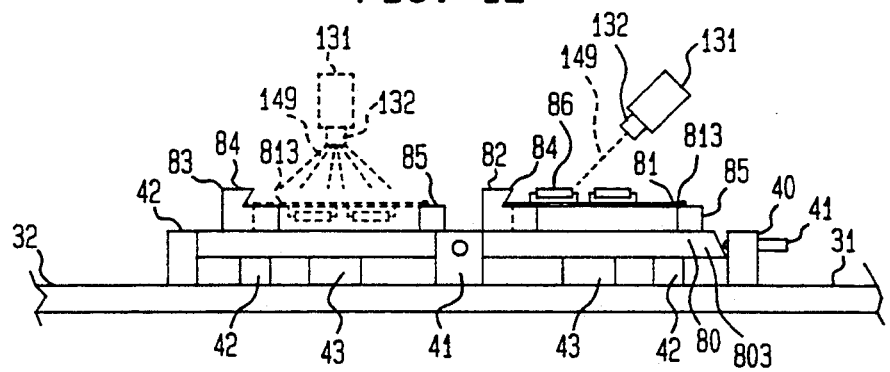
FIG. 12 is an elevational view showing the manner of performing work on a workpiece at the work station as indicated in FIG. 11.
Figure 13:
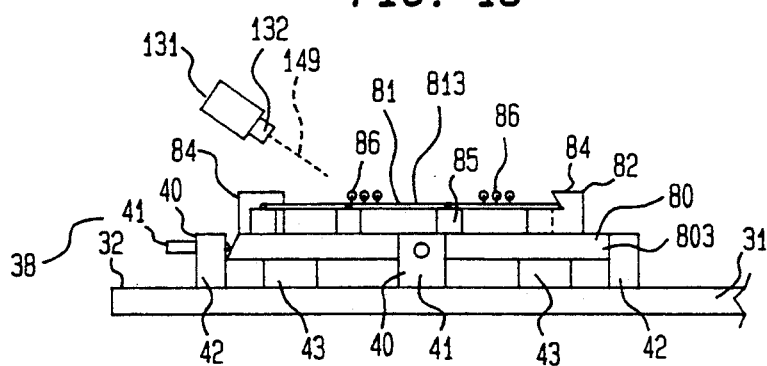
FIG. 13 is a side view of the arrangement shown in FIG. 12.
Figure 11:
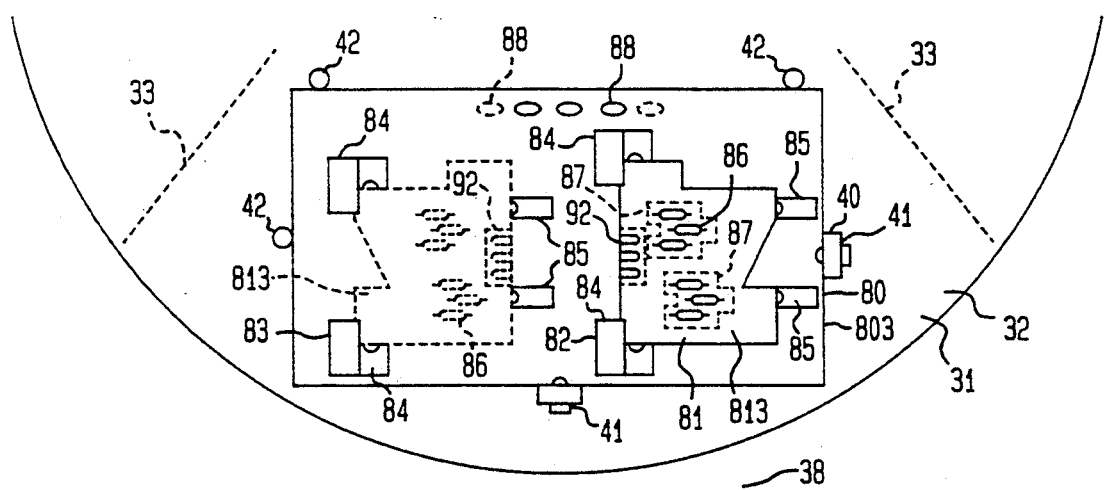
FIG. 11 is a top view of the portion of the apparatus of FIG. 3 at the work station showing a third type workpiece.
Figure 14:
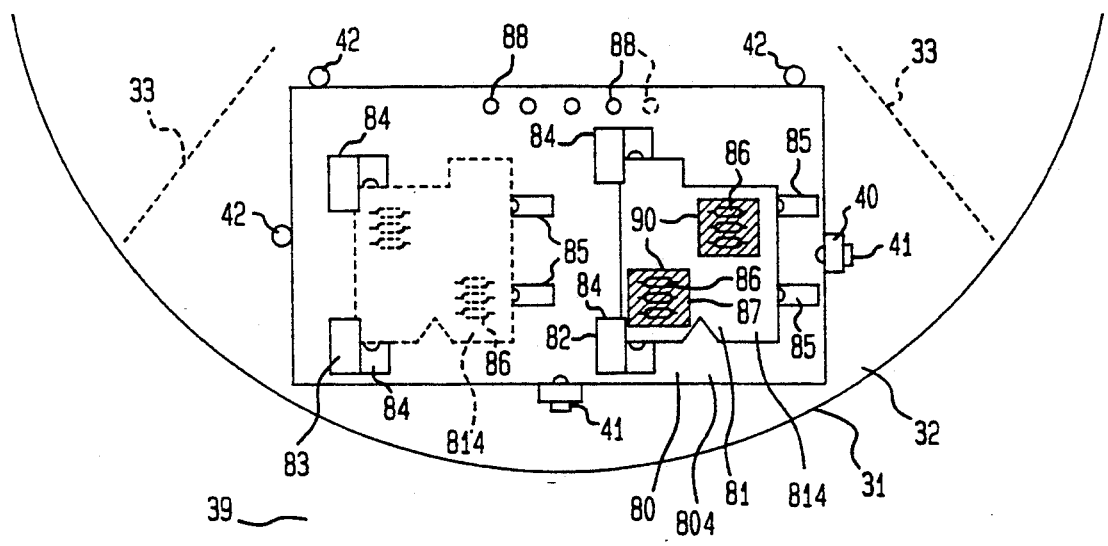
FIG. 14 is a top view of the portion of the apparatus of FIG. 3 at a counterpart load-unload station between the work station and load-unload station, showing a fourth type workpiece on which work has been performed at the work station.

FIGS. 5, 6 and 7 are top, exploded and elevational views, respectively, of the portion of apparatus 30 at load-unload station 36 per FIG. 3, with a first type carrier 80 as a pallet 801 holding a first type workpiece 81 as a circuit board 811. FIGS. 8, 9 and 10 are top, side and elevational views, respectively, of the portion of apparatus 30 at sensing station 37 per FIG. 3, with a second type carrier 80 as a pallet 802 holding a second type workpiece 81 as a circuit board 812. FIGS. 11, 12 and 13 are top, elevational and side views, respectively, of the portion of apparatus 30 at work station 38 per FIG. 3, with a third type carrier 80 as a pallet 803 holding a third type workpiece 81 as a circuit board 813. FIG. 14 is a top view of the portion of apparatus 30 at counterpart load-unload station 39 per FIG. 3, with a fourth type carrier 80 as a pallet 804 holding a fourth type workpiece 81 as a circuit board 814 on which work has been performed at the work station 38.

Figure 15:
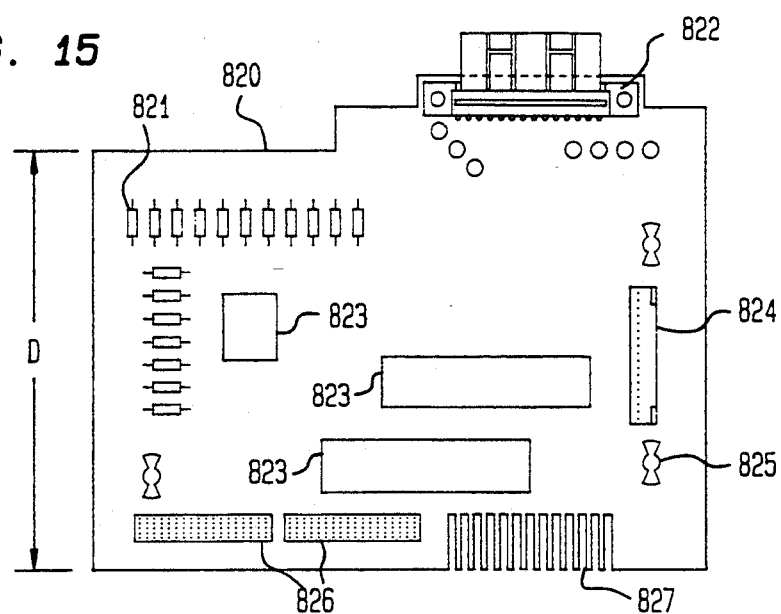
FIG. 15 is a top view of a fifth type workpiece usable in the apparatus of FIG. 1.
Figure 16:
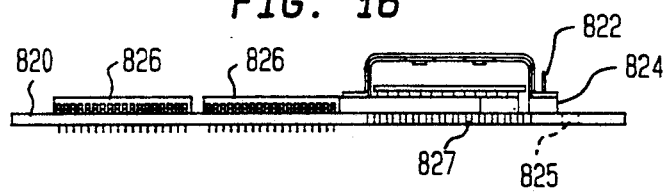
FIG. 16 is an elevational view of the workpiece of FIG. 15.
Figure 17:
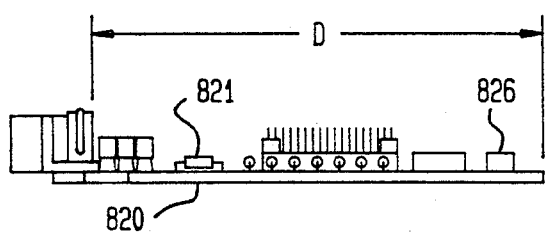
FIG. 17 is a side view of the workpiece of FIG. 15.
Figure 24:
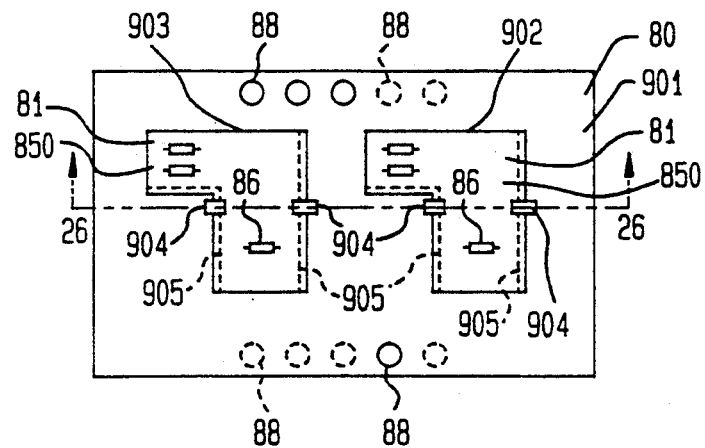
FIG. 24 is a top view of the top side of another type carrier holding two associated type workpieces.
Figure 25:
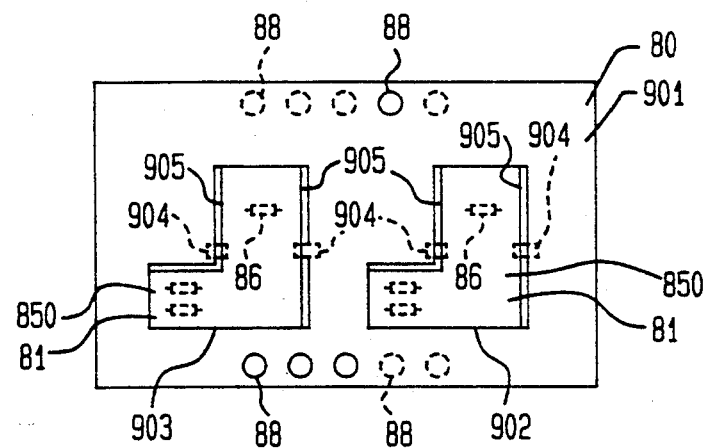
FIG. 25 is a top view of the bottom side of the reversed carrier of FIG. 24.
Figure 26:
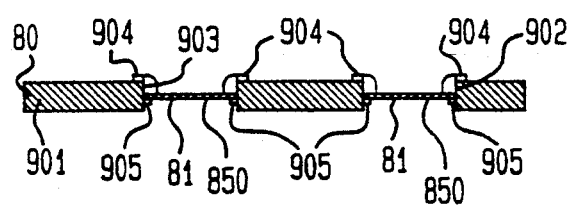
FIG. 26 is a sectional view of the arrangement of FIG. 24.

FIGS. 15, 16 and 17 are top, elevational and side views, respectively, of a fifth type workpiece 81 as a circuit board 820. FIGS. 18, 19 and 20 are top, elevational and side views, respectively, of a sixth type workpiece 81 as a circuit board 830. FIGS. 21, 22 and 23 are top, elevational and side views, respectively, of a seventh type workpiece 81 as a circuit board 840. FIGS. 24, 25 and 26 are top side, bottom side and sectional views, respectively, of a reversible pallet 901 having apertures 902 and 903 holding two further associated type circuit boards 805 via clips 904 and ledges 905.

Referring now to FIGS. 1, 3 and 4, apparatus 30 is used for performing work on workpieces 81 of different types in random order in assembly line fashion, such as four different types of circuit boards 811, 812, 813 and 814 having circuit components 86 in various patterns denoted as predetermined portions 87.

Rotary table 31 of apparatus 30 forms a turntable or dial having, e.g., four, circumferentially spaced-apart table sections 32. Table 31 is mounted on support 50 for stepwise (cam indexed) rotation by motor 70 as rotating means. Motor 70 comprises a conventional indexer that rotates table 31 to move each section 32 in cycles successively at selective intervals from load-unload station 36 to sensing station 37 for sensing the type and orientation of the workpieces 81 by sensing means 100 thereat, next to work station 38 for performing work on the workpieces 81 by work performing means 130 thereat, then to counterpart load-unload station 39, and in turn back to load-unload station 36, all under the control of control means 170.

A plurality of different types of carriers 80, such as four different types of pallets 801, 802, 803 and 804, are receivable in random order respectively by receiving means 40 on sections 32. Each type carrier 80 is distinctive (dedicated) for carrying an associated type of workpiece 81 different from that of each of the other types of carriers 80, and has holder means (fixtures) such as a right side holder 82 and a left side holder 83 for holding its associated type workpiece 81 in two alternative (positional or spatial) orientations.

As shown in FIG. 3, workpieces 81 may be circuit boards 811, 812, 813 and 814 having circuit components 86 on one side or face (e.g., top side or component side) and component solder sites on the opposite side or face (e.g., bottom side or solder side). Each board may be held by the respective right holder 82 in a right side orientation, e.g., with its component side up and solder side down (shown in solid line), or alternatively by the respective left holder 83 in a left side orientation, e.g., with its component side down and solder side up (shown in dashed line), for performing work (applying a coating) on respectively predetermined portions 87 thereof in each orientation.

Table 31 is conveniently provided in horizontal orientation, for rotation about a generally vertical axis, and constitutes a circular ring-shaped member having a central aperture 34 and a periphery 35. Table 31 is divided typically into four quadrant-like (angularly rotationally spaced-apart) sections 32 separated by imaginary radial dividing lines 33 (shown as dashed lines), so that the sections 32 are correspondingly adjacent the load-unload station 36, sensing station 37, work station 38 and counterpart load-unload station 39, between intervals of successive stepwise movement of table 31 by motor 70.

As is clear from FIGS. 3 and 4, aperture 34 is provided with a formation defining a driven gear 45 that is engaged by a driving gear 72 on the drive shaft 71 of motor 70. Motor 70 is powered via a conduit 73 from control means 170 to rotate (index) table 31 stepwise at selective intervals. Motor 70 is mounted on a bracket 53 on the underside of support 50 so that drive shaft 71 extends upwardly through an opening 54 in support 50 to position drive gear 72 in engagement with driven gear 45.

Support 50 is maintained at desired height by legs 51 and has a bearing 52, such as a roller bearing race, on its upper side that acts as a thrust bearing for rotatably carrying table 31 thereon. The underside of table 31 defines a journal 44 that coacts with bearing 52 on the upper side of support 50 so as to mount table 31 rotatably on support 50 for stepwise rotation.

As sensing means 100 and related components are conveniently mounted centrally of table 31 to conserve space, yet must remain stationary when table 31 rotates, a shelf 55 is provided on support 50 to carry sensing means 100 above table 31. Shelf 55 has a hollow hub 56 on its underside that seats in a well 57 in support 50 that has a well bore 58 through which the common power conduit 110 from sensing means 100 extends for connection to control means 170. Because of this arrangement, table 31 must be accommodated rotationally in a manner not interfering with the supporting structure for shelf 55, yet with the load of table 31 being transmitted to support 50 in any movement position thereof.

Use of a bearing 52 on the upper side of support 50 to engage the underside of table 31, in conjunction with the coaction of drive gear 72 of motor 70 and driven gear 45 of table 31, is only one means for providing rotational support of table 31 for stepwise movement under the action of motor 70, without interfering with the disposition of shelf 55 and sensing means 100. Any other arrangement of these parts may be employed to provide the same functions and purposes, as means for mounting rotary tables for stepwise (indexed) rotation are well known.

For instance, driven gear 45 may instead be formed as a peripheral gear on the exterior of a hub (not shown) downwardly extending from aperture 34 for engaging drive gear 72.

Motor 70 is controlled by control means 170 for rapid stepwise rotation (dialing) of table 31 at operator selective predetermined intervals, typically indexing table 31 (i.e., rotating table 31 stepwise) a precise 90° increment in about 2 seconds, and executing a complete cycle (revolution of a given section 32), including interim sensing and work performing between movement increments, in about 48–68 seconds, depending on the work, as explained below. Motor 70 moves (cam indexes) each section 32 to the same precise position at each station, so that all sections 32 successively occupy the same common area at load-unload station 36, at sensing station 37, at work station 38 and at counterpart load-unload station 39.

An overload clutch mechanism (not shown) may be provided, e.g., on drive shaft 71, to disengage drive gear 72 of motor 70 from driven gear 45 of table 31, should jamming occur during stepwise incremental rotation of table 31.

Referring now to FIG. 6, receiving means 40 may comprise a set of cooperating latches 41, stops 42 and bosses 43 on each section 32 of table 31 for releasably stationarily receiving a respective carrier 80 thereon, i.e., at load-unload station 36. All carriers 80 may be of common shape and size, enabling them to be received interchangeably by the set of latches 41, stops 42 and bosses 43 forming receiving means 40 on each section 32. Receiving means 40 are identically positioned on each section 32 to position each carrier 80 at the same location thereon. Thus, as motor 70 moves each section 32 to the same position at each station, all carriers 80 will successively occupy the same common area at load-unload station 36, at sensing station 37, at work station 38 and at counterpart load-unload station 39.

Referring now to FIGS. 5, 8, 11 and 14, each carrier 80 constitutes a fixture (pallet) that has a right side holder 82 and a left side holder 83 that are distinctive for holding its associated type of workpiece 81. Holders 82 and 83 may each be formed of a set of cooperating latches 84 and stops 85 on the given carrier 80 that is specifically arranged for releasably stationarily holding its type workpiece 81 only. The set of latches 84 and stops 85 of the right holder 82 of a given carrier 80 may be in side-by-side arrangement with the set of latches 84 and stops 85 of its left holder 83, so that its workpiece 81 is positioned on the right holder 82 in mirror image fashion to the position of such workpiece 81 when held on the left holder 83.

Each set of holders 82 and 83 is identical in arrangement on carriers 80 of the same type but differs in arrangement from those sets on carriers 80 of the other types, in dependence upon the shape and size of the associated type workpiece 81 to which the set of holders 82 and 83 is dedicated. However, all sets of holders 82 and 83 occupy essentially the same corresponding areas on all carriers 80. Thus, as motor 70 moves each section 32 to the same position at each station, all sets of holders 82 and 83 successively occupy the same common areas at load-unload station 36, at sensing station 37, at work station 38 and at counterpart load-unload station 39.

As shown in FIG. 5, each pallet 801 has a right holder 82 as a set of latches 84 and stops 85 dedicated for holding a circuit board 811 with its component side facing up, and a left holder 83 as a set of latches 84 and stops 85 dedicated for holding a circuit board 811 with its component side facing down, i.e., in mirror image to its position on the right holder 82.

As shown in FIG. 8, each pallet 802 has a right holder 82 as a set of latches 84 and stops 85 dedicated for holding a circuit board 812 with its component side facing up, and a left holder 83 as a set of latches 84 and stops 85 dedicated for holding a circuit board 812 with its component side facing down, i.e., in mirror image to its position on the right holder 82.

As shown in FIG. 11, each pallet 803 has a right holder 82 as a set of latches 84 and stops 85 dedicated for holding a circuit board 813 with its component side facing up, and a left holder 83 as a set of latches 84 and stops 85 dedicated for holding a circuit board 813 with its component side facing down, i.e., in mirror image to its position on the right holder 82.

As shown in FIG. 14, each pallet 804 has a right holder 82 as a set of latches 84 and stops 85 dedicated for holding a circuit board 814 with its component side facing up, and a left holder 83 as a set of latches 84 and stops 85 dedicated for holding a circuit board 814 with its component side facing down, i.e., in mirror image to its position on the right holder 82.

Referring now to FIG. 7, this releasable holding arrangement enables a given workpiece 81 to be switched from the right holder 82 of its associated carrier 80 to the left holder 83 thereof, e.g., by manually lifting the workpiece 81 from the right holder 82, turning or flipping it over to reverse its orientation, as indicated by the arrow 91 (shown in dashed line), and placing it on the left holder 83. However, as all such carriers 80 (pallets) are of common shape and size, they may be received by the receiving means 40 at each section 32 in random order.

Any other receiving means 40 than latches 41, stops 42 and bosses 43 may be used to receive carriers 80 on the respective sections 32, and any other holder means than latches 84 and stops 85 as right holders 82 and left holders 83 may be used to hold the associated type workpieces 81 on their dedicated carriers 80, so long as the above functions and purposes are attained.

Edge connector areas 92 often occupy local portions on both sides of a circuit board 813 (see FIG. 11). Accordingly, both sides of the circuit board 813 must first be masked by a masking type coating material if the board is to be conformal coated. This is one reason for providing each carrier 80 with two board positions or orientations. In the first position on right holder 82, one side, e.g., the top side (face), of the board is coated in a first cycle of table 31. On completing the first cycle, the circuit board 813 is flipped over and placed in the second position on left holder 83 so that its opposite side, e.g., the bottom side (face) can be coated in a second cycle of table 31.

Referring now to FIGS. 9 and 10, and also to FIGS. 1, 3 and 8, it is seen that sensing means 100 includes a series of, e.g., five, side-by-side conventional workpiece type identifying sensors 101, e.g., photoelectric cells, and a pair of conventional workpiece orientation identifying sensors,, e.g., photoelectric cells, positioned side by side as a right side orientation sensor 102 and a left side orientation sensor 103.

Workpiece type identifying sensors 101 are arranged on shelf 55 to overlie the radially inner edge portion of each carrier 80 at sensing station 37. Type sensors 101 cooperate with indicator means such as a series of up to four code holes 88 in any of five code positions at the radially inner edge of the carrier 80 that register with the corresponding type sensors 101 and that are unique to and distinguish the particular type carrier 80 from the other types of carriers 80. Each type sensor 101 senses (reads) when a hole 88 is absent from its registering position on the carrier 80, and the five type sensors 101 collectively sense the type carrier 80 (and thus its type workpiece 81) then at sensing station 37 and send this sensed information to control means 170.

As shown in FIGS. 8 and 10, type sensors 101 are photoelectric signal beam projectors, each projecting a beam 89 aimed at a corresponding position on the carrier 80 at sensing station 37 at which a hole 88 is either present (shown in solid line) or absent (shown in dashed line), issuing a response signal to control means 170 only if a hole 88 is absent. The beam 89 is interrupted by and thereby senses the surface of the carrier 80 at the blank (non-hole) code position.

As is clear from FIG. 5, showing the section 32 at load-unload station 36, pallet 801 has a hole 88 at the first and fifth positions of the series, but lacks a hole 88 at the second, third and fourth positions (denoted by dashed line), thereby indicating that pallet 801 is dedicated to circuit boards 811.

As is clear from FIG. 8, showing the section 32 at sensing station 37, pallet 802 has a hole 88 at the first, second and fifth positions of the series, but lacks a hole 88 at the third and fourth positions (denoted by dashed line), thereby indicating that pallet 802 is dedicated to circuit boards 812.

As is clear from FIG. 11, showing the section 32 at work station 38, pallet 803 has a hole 88 at the second, third and fourth positions of the series, but lacks a hole 88 at the first and fifth positions (denoted by dashed line), thereby indicating that pallet 803 is dedicated to circuit boards 813.

As is clear from FIG. 14, showing the section 32 at counterpart load-unload station 39, pallet 804 has a hole 88 at each of the first four positions of the series, but lacks a hole 88 at the fifth position (denoted by dashed line), thereby indicating that pallet 804 is dedicated to circuit boards 814.

Type sensors 101 operate in known manner to sense the absence of holes 88 at the code positions of a carrier 80, and the response signals that identify the type workpiece 81, i.e., by identifying its dedicated associated type carrier 80 in terms of the number and location of holes 88 (and blanks) thereon, are fed via the corresponding conduits 108 (FIG. 3) and common conduit 110 (FIG. 4) to control means 170.

As shown in FIGS. 3, 8 and 9, right workpiece orientation sensor 102 and left workpiece orientation sensor 103 are photoelectric signal beam projectors that project a right beam 104 and a left beam 105, respectively (indicated by dashed lines). Orientation sensors 102 and 103 cooperate with a pair of correspondingly aligned side-by-side conventional retro-reflectors, denoted as right retro-reflector 106 and left retro-reflector 107, respectively, on support 50 radially outwardly of the carrier 80 at sensing station 37 to determine the presence or absence of a workpiece 81 on each of the right holder 82 and left holder 83 of the carrier 80.

Orientation sensors 102 and 103 are "parts presence sensors" in that they each sense the presence (or absence) of a workpiece 81. At the same time, they are "orientation sensors" in that if a part (workpiece) is present, not only is its presence sensed but also its orientation automatically as well, because the part must be in a corresponding orientation, i.e., on its right holder 82 or left holder 83, as the case may be.

If a workpiece 81 is present on the right holder 82, so as to occupy a first (right) region relative to its carrier 80, right beam 104 projected by right orientation sensor 102 is interrupted by the workpiece 81 (FIG. 9) and not reflected back thereto by right retro-reflector 106.

Right orientation sensor 102 senses (reads) the presence of a workpiece 81 on the right holder 82 and inherently its orientation (component side up, solder side down), issuing a signal fed as information (workpiece presence and orientation) to control means 170. If no workpiece 81 is positioned on the right holder 82, the right beam 104 is reflected back to right orientation sensor 102 by right retro-reflector 106. In this case, the absence of a workpiece 81 on the right holder 82 is sensed (read), and no signal is sent to control means 170 (thereby indicating workpiece absence).

If a workpiece 81 is present on the left holder 83, so as to occupy a second (left) region relative to its carrier 80 and which is distinct from the first region, left beam 105 projected by left orientation sensor 103 is interrupted by the workpiece 81 and not reflected back thereto by left retro-reflector 107. Left orientation sensor 103 senses (reads) the presence of a workpiece on the left holder 83 and inherently its orientation (component side down, solder side up), issuing a signal fed as information (workpiece presence and orientation) to control means 170. If no workpiece 81 is positioned on the left holder 83, left beam 107 is reflected back to left orientation sensor 103 by left retro-reflector 107. In this case, the absence of a workpiece 81 on the left holder 83 is sensed (read), and no signal is sent to control means 170 (thereby indicating workpiece absence).

Orientation sensors 102 and 103 operate in known manner to sense the presence or absence of a workpiece 81 at either the right or left holder position on a carrier 80, and the signals are fed as information via the corresponding conduits 109 (FIG. 3) and common conduit 110 (FIG. 4) to control means 170.

This information is used when the carrier 80 next moves to work station 38, to program work performing means 130 to perform work on a previously sensed workpiece 81 on right holder 82, or alternatively to perform work on a previously sensed workpiece 81 on left holder 83. If no workpiece 81 had been previously sensed on either the holder 82 or holder 83 of that carrier 80, then work performing means 130 is programmed not to operate, and the empty carrier 80 indexes to counterpart load-unload station 39 as is, on the next stepwise movement of table 31.

As may be seen from FIGS. 1, 3 and 4, work performing means 130 may be a conventional robotic arrangement of dispensing means formed of spray gun 131 and its spray nozzle 132, moved by moving means 133 (e.g., a robot) along a predetermined spray path. This arrangement is usable for selectively applying a flowable coating material 149 onto predetermined portions 87 of a workpiece 81, i.e., corresponding to a pattern of components 86 thereon, at work station 38, denoting a coating station. Such arrangement is operated in dependence upon the type and orientation of the workpiece 81 previously sensed at sensing station 37.

Moving means 133 may be formed of a base 134 supporting a vertical spindle 135 that pivotally mounts a cantilever arm 136 rotatable thereon in the back and forth directions of the arrow 137. A floating arm 138 is pivotally mounted on the outer end of cantilever arm 136 and is rotatable thereon in the back and forth directions of the arrow 139. The outer end of floating arm 138 operatively mounts a vertical shaft 140 for vertical movement in the up and down directions of the arrow 141 and independently for rotation in the back and forth directions of the arrow 142. The lower end of shaft 140 pivotally carries a wrist member 143 that is tiltable about the horizontal pivot 144 in the up and down pivotal directions of the arrow 145.

As is clear from FIG. 1, coordinated conjoint rotation of cantilever arm 136 and floating arm 138, i.e., in the manner of a swivel stand, permits spray gun 131 to move in a horizontal linear first direction, corresponding to movement along the X axis between the right and left sides of a carrier 80 on the section 32 at work station 38, as well as in a horizontal linear second direction, corresponding to movement along the Y axis, i.e., crosswise of the X axis, between the radially outer or front end (adjacent base 134) and radially inner or back end (adjacent shelf 55) of the given carrier 80 thereat. Thus, spray gun 131 may be moved along any area portions of a workpiece 81 on a given right holder 82 or left holder 83 of the carrier 80.

At the same time, vertical movement of shaft 140 relative to floating arm 138 permits spray gun 131 to move in a vertical linear third direction, corresponding to movement along the Z axis, i.e., crosswise of the X axis and of the Y axis. This enables spray gun 131 to move to any height above a given workpiece 81 on a carrier 80 at work station 38.

Also, coordinated conjoint rotation of vertical shaft 140 relative to floating arm 138 and of wrist member 143 relative to vertical shaft 140 permits spray gun 131 to move in a rotational fourth direction, corresponding to rotation about the vertical rotational R axis, as well as in a rotational fifth direction, corresponding to tilting rotation about the horizontal tilting T axis, i.e., crosswise of the R axis. Thus, spray gun 131 may be positioned in any spatial orientation relative to any portions of a given workpiece 81 on a carrier 80 at work station 38.

By suitable coordination of these movements, e.g., predetermined by appropriate programming of the operation of moving means 133, spray gun 131 may be moved in the directions of the five axes X, Y, Z, R and T, independently or collectively, to place spray gun 131 at any desired horizontal and vertical location and spatial orientation relative to a workpiece 81 or its components 86, on a carrier 80 at work station 38.

Referring now to FIGS. 12 and 13, and also to FIGS. 1, 3, 4 and 11, it is seen that this 5-axis movement of spray gun 131 permits spray nozzle 132 to direct flowable coating material 149 to all local sites of a workpiece 81 at work station 38 to assure precise coating of all pertinent predetermined portions 87, including components 86, regardless of their individual shape and height relative to the circuit board surface.

For example, moving means 133 is automatically programmed consequent sensing of a pallet 803 and thereby its type circuit board 813, and the orientation (and thus presence) of the latter on its right holder 82 (or on its left holder 83, as the case may be), when the pallet is first moved (indexed) to sensing station 37 from load-unload station 36. When that pallet 803 is next moved (indexed) to work station 38, moving means 133 moves spray gun 131 in desired manner to place spray nozzle 132 in the range of the predetermined portions 87 of circuit board 813 to be coated in dependence upon that previous sensing.

At work station 38, spray gun 131 is accordingly moved along a predetermined path relative to the first side of circuit board 813 on right holder 82 (or relative to the second or opposite side of circuit board 813 on left holder 83, as the case may be), in conventionally programmed manner to apply coating material 149 to its predetermined portions 87 to form a coating 90 (FIG. 14).

As is clear from FIGS. 3 and 4, moving means 133 is powered in conventional manner via control conduit 146 that is connected to control means 170. Coating material 149 is supplied to spray gun 131 via feed line 147, and the solenoid valve (not shown) for operating spray gun 131 is actuated via valve control conduit 148. In this way, coating material 149 may be sprayed in precise dosage onto predetermined portions 87 of a workpiece 81 at work station 38 to form the given coating 90.

For instance, moving means 133 may be programmed to move spray gun 131 from a retracted position remote from table 31 to a proximate position adjacent table 31 and overlying the particular workpiece 81 either on the right holder 82 or left holder 83 of the carrier 80 thereat. Then, valve control conduit 148 under the control of control means 170 actuates the spray gun valve (not shown) to spray coating material 149 from spray nozzle 132 onto the predetermined portions 87 of the workpiece 81, as programmed by control means 170 in dependence upon the information previously received for that workpiece 81 when it was sensed at sensing station 37 by sensing means 100.

This information from sensing means 100 is fed to previously stored information in control means 170 for operating moving means 133 and spray gun 131 (denoting a robotic coating arm and coating dispenser unit). The stored information includes X, Y and Z axis coordinates of the predetermined portions 87 to be coated, and concordant R and T axis information used in conjunction therewith in operating spray gun 131.

On completion of the spraying of the pertinent predetermined portions 87, valve control conduit 148, under the control of control means 170, actuates the spray gun valve (not shown) to stop the spraying operation. In turn, moving means 133, also under the control of control means 170, stops further movement of spray gun 131 and then retracts it from table 31.

In order to obtain a uniform coating efficiently, typically spray gun 131 accelerates to coating speed, moves to a location close to the surface of the circuit board, and only then starts ejection of coating material 149 from spray nozzle 132. It is important to maintain ejection or spraying of coating material 149 at a continuous and uniform rate, and to move spray nozzle 132 at a continuous and uniform speed until a coated strip of desired configuration and length is obtained on the board. When a sufficient length of the desired configuration coating strip has been provided, ejection of coating material 149 from spray nozzle 132 is discontinued, and only then is movement of spray gun 131 slowed to a stop.

Preferably, for maximizing efficiency, spray gun 131 is simultaneously withdrawn from the circuit board to its retracted position during the time it is being slowed to a stop.

As may be seen from FIGS. 3 and 11, if maskant type coating material is to be applied by a spray gun 131 having 3-axis movement, i.e., for coordinated movement relative to the X, Y and z axes as shown in FIG. 1, it may be readily applied to an edge connection area 92, as a predetermined portion 87 on a circuit board. In particular, if the edge connection area 92 does not have electrical components on its opposite ends, i.e., that would occupy a raised height relative to the edge connector area 92 so as to interfere with the path of travel of the spray gun 131, then spray nozzle 132 can be lowered initially into sliding engagement with the circuit board surface to apply the coating.

Thereafter, spray nozzle 132 can be accelerated laterally to coating velocity along the board, and coating material 149 dispensed when spray nozzle 132 reaches the first part of the edge connector area 92 that is to be masked. When spray nozzle 132 finishes passing over the last part of the edge connector area 92 to be masked, dispensing from spray nozzle 132 can be stopped, and spray nozzle 132 can then be decelerated to zero velocity and withdrawn from the board.

If the given spray gun 131 is arranged for 5-axis movement, i.e., for coordinated movement relative to the X, Y, Z, R and T axes as shown in FIG. 1, its acceleration and deceleration can occur while spray nozzle 132 is being brought toward the board to dispense coating material 149 and while it is being removed from the board after dispensing has been completed.

Spray gun 131 is desirably provided as a conventional airless spray gun that dispenses coating material 149 from spray nozzle 132 as pressure atomized liquid particles for precise delivery to the pertinent predetermined portions 87 without overspraying coating material 149 onto adjacent portions of the workpiece 81 that are not intended to be sprayed. On the other hand, airspray-type spray guns, that use air to dispense the coating material, are not as desirable for the purposes of the invention, as they cannot be closely controlled and tend to overspray the coating material onto such adjacent portions.

Feed line 147 is supplied with coating material 149 from a supply means such as a reservoir pot 150 in a pressure tank 151, sealed by a removable cover 152, and kept under selective delivery pressure by an automatically controlled air pump 153, e.g., connected by a conduit (not shown) to control means 170, and communicating via a pressure line 154 with tank 151. Tank 151 may have an air bleed valve (not shown) to reduce its pressure. Feed line 147 is connected to a supply tube 155 immersed in the coating material 149 in pot 150. A supply indicator (not shown), e.g., connected to control means 170, may be used to indicate the level of coating material 149 in pot 150.

The pressure generated in tank 151 by pump 153 feeds coating material 149 upwardly through supply tube 155 and feed line 147 to spray gun 131 for spraying from nozzle 132 under the control of valve conduit 148. Coating material 149 is brought to selective spraying temperature by an electric heater 156 at the entrance of feed line 147 into spray gun 131. Heater 156 is energized by a power conduit 157 connected to control means 170.

The time for sensing the workpieces 81 at sensing station 37 is essentially instantaneous. Given that moving means 133 and spray gun 131 typically form elements of a programmable robotic unit operating at high speed, the time for coating the workpieces 81 at work station 38 may be about 10–15 seconds, depending on the extent of the predetermined portions 87 to be coated. The time for unloading and reloading carriers 80, or turning over a workpiece 81, at load-unload station 36 may be about 8–15 seconds, given the releasable nature of receiving means 40 and of holders 82 and 83, and the simple manual tasks involved.

Assuming that it takes about 10–15 seconds to coat each workpiece 81 at work station 38, and about 8–15 seconds to unload and reload each carrier 80 or turn over its workpiece 81 (and switch it from one of holders 82 and 83 to the other) at load-unload station 36, the total processing time per cycle (revolution) of table 31 will be about 40-60 seconds, i.e., between successive movements of the four sections 32. This is because the individual operations at work station 38 and load-unload station 36 occur simultaneously, and each exceeds the instantaneous sensing time at sensing station 37. If table 31 takes about 2 seconds to index each of the four sections 32 from one station to the next, for a total of about 8 seconds per cycle, the total time per cycle will be about 48-68 seconds.

The residence time of each section 32 at each station is determined by the coating time at work station 38 or by the operator manipulation time at load-unload station 36, whichever is longer. The operator manipulations may take longer, at least where carrier unloading and reloading occurs in the interval between stepwise movements of sections 32. However, as the coating time usually varies from one workpiece 81 to the next, depending on the number, size and intricacy of the predetermined portion or portions 87 to be coated, this may exceed the operator manipulation time. In any case, the total time per cycle of table 31 will normally not exceed about 68 seconds.

A unique feature of apparatus 30 according to the invention is that all operations at the pertinent stations are effected simultaneously between intervals of stepwise movement of table 31. Thus, a workpiece 81 on each section 32 is successively moved in assembly line fashion from one station to the next for sequential operation at each of the pertinent stations, while respective cognate operations are being performed simultaneously at each of the other pertinent stations. The total processing time is therefore reduced to a minimum, with no additional cycle time being needed to accomplish any of the contemplated individual operations, even though the workpieces 81 may differ in type and orientation in random order on the four sections 32.

Operation of apparatus 30 may be controlled manually by an operator at load-unload station 36 using a conventional local control panel 171 on a swivel stand 172 mounted on shelf 55, and connected via conduit 173 with sensing means 100, such that conduits 108 and 109 of sensing means 100 and conduit 173 of control panel 171 form the common conduit 110 that passes via bore 58 in support 50 to control means 170. As shown in FIG. 4, control means 170 has a suitable display (read out) 174, a main control and programming panel 175, and a conventional computer processor 176 (shown in dashed line). Manual operation of local control panel 171 overrides the control of control means 170.

As shown in FIGS. 3 and 4, to insure safe operation of apparatus 30 at work station 38, spray gun light screen means 180 are provided. Screen means 180 include a vertical photoelectric curtain beam emitter 181 and a vertical photoelectric curtain beam receiver 182, plus three vertical beam reflecting mirrors 183, to provide a vertical light curtain beam 184 (shown in dashed line). Beam emitter 181 and beam receiver 182 are mounted at right angles to each other on support 50 by a bracket 185. The three mirrors 183 are mounted on support 50 by the respective brackets 186, 187 and 188 at right angles to each other. The first and third mirrors 183 are also mounted at a 45° angle to beam emitter 181 and beam reflector 182, respectively.

Brackets 185, 186, 187 and 188 are arranged on platform 50 at the four corners of a rectangular space enclosing the range of movement envelope of work performing means 130, to provide beam emitter 181, beam receiver 182 and the three mirrors 183 in optical alignment to form a personnel safety net. Beam emitter 181 and beam receiver 182 are conventional and operate in known manner. On disturbing the signal beam emitted by beam emitter 181 and reflected by the three mirrors 183 to beam receiver 182, an interruption signal issues that is sent to control means 170.

Beam emitter 181 is aimed to emit curtain beam 184 to the first mirror 183 on bracket 186, which is arranged at a 45° angle thereto, to reflect it to the second mirror 183 on bracket 187. The second mirror 183 is arranged on bracket 187 at a 90° angle to the first mirror 183, to reflect curtain beam 184 to the third mirror 183 on bracket 188. The third mirror 183 is arranged on bracket 188 at a 90° angle to the second mirror 183, and at a 45° angle to beam receiver 182, to reflect curtain beam 184 back to beam receiver 182 to complete the enclosing safety net. Beam emitter 181 and beam receiver 182 are connected to control means 170 by common control conduit 189. If curtain beam 184 is interrupted by any personnel, on receiving such interruption signal, control means 170 is programmed to stop apparatus 30.

As shown in FIGS. 3 and 4, for operator safety and optional operator controlled operation of apparatus 30, operator light screen means 190, like spray gun light screen means 180, are provided at load-unload station 36. Screen means 190 include a vertical photoelectric curtain beam emitter 191 and a vertical photoelectric curtain beam receiver 192 to provide a vertical light curtain beam 193 (shown in dashed line in FIG. 3). Beam emitter 191 and beam receiver 192 are mounted in facing alignment on support 50 by brackets 194 and 195, respectively, on the left and right sides of the operator area at load-unload station 36. Beam emitter 191 and beam receiver 192 position curtain beam 193 between periphery 35 of table 31 and the operator zone radially outwardly thereof. Beam emitter 191 and beam receiver 192 are conventional and operate in known manner. On disturbing the signal beam emitted by beam emitter 191, an interruption signal issues that is sent to control means 170.

Beam emitter 191 and beam receiver 192 are connected to control means 170 by their respective control conduits 196 and 197 that are combined in common control conduit 198. If curtain beam 193 is interrupted, on receiving such interruption signal, control means 170 stops apparatus 30 or keeps it from starting if it is already stopped. This insures operator safety, and optionally enables the operator to start the next indexing (incremental stepwise movement) of table 31 upon completing the operator tasks at load-unload station 36, i.e., by programming control means 170 to start and stop movement of table 31 by the operator interrupting and ceasing to interrupt curtain beam 193.

Referring now to FIG. 2, control means 170 is shown with its computer processor 176 connected to the various control conduits of the elements of apparatus 30 that are automatically operated. Processor 176 is programmed to control apparatus 30 under the overriding manual control of local control panel 171, for automatic operation of motor 70, workpiece orientation sensors 102 and 103, workpiece type sensors 101, moving means 133 for moving spray gun 131, the spray gun valve for nozzle 132, coating material heater 155, spray gun light screen means 180 and operator light screen means 190.

As is clear from FIGS. 1, 3, 5, 6 and 7, the operator at load-unload station 36 may operate apparatus 30 via local control panel 171 for selective timed sequence stepwise rotation of table 31 to move each section 32, so that a processed workpiece 81 arriving at load-unload station 36 may be manually unloaded by removing its carrier 80 from the receiving means 40 (FIG. 6) and placing that carrier on the adjacent conveyor 200 (FIG. 1), or on a separate conveyor (not shown), followed by the replacing of the removed carrier 80 on the same receiving means 40 with another carrier 80 delivered thereto in random sequence by conveyor 200.

Where both sides of the workpiece 81 are to be coated, after being coated on one side on right holder 82 and arriving at load-unload station 36 at the end of a first cycle, the operator can efficiently remove the workpiece 81 from right holder 82, turn it over (flip it 180°) to expose its other, mirror image, side and place it in that reverse side orientation on left holder 83 (FIG. 7). The workpiece 81 will then repeat the cycle to coat the reverse side at work station 38 after being sensed in its changed orientation at sensing station 37. When the workpiece 81 again arrives at load-unload station 36, its carrier 80 can be unloaded and replaced by another carrier 80.

To increase the production rate, a second operator may be located at counterpart load-unload station 39, and the loading, turning over and unloading operations shared by both operators. For instance, the second operator at counterpart load-unload station 39 can unload those carriers 80 in random order that hold a workpiece 81 on which all work has been completed, while the first operator at load-unload station 36 loads fresh carriers 80 in random order on previously unloaded (empty) sections 32. The two operators can alternate the turning over of a workpiece 81 from right holder 82 to left holder 83 on a carrier 80 (FIG. 7) when work has been performed on one side of the workpiece 81 in a first cycle and is still to be performed on the opposite side in a second cycle. The counterpart load-unload station 39 may also have a light screen means 190 (not shown), for the same purposes.

The carriers 80 holding coated workpieces 81 removed from table 31 at load-unload station 36 may be sent to a curing station (not shown) for conventional curing (i.e., heating) of the coatings 90. Coating material 149, whether of masking or conformal type, must normally be cured. This is effected at an off-line site, e.g., by heating in an elevated temperature curing oven or by exposure to ultraviolet light in an ultraviolet light oven, depending on the coating material.

However, as disclosed in applicant's said related copending application, apparatus 30 is there provided with a curing station 39 in place of counterpart load-unload station 39, whereby curing of the coatings 90 applied to the workpieces 81 is effected on-line, while the workpieces 81 (circuit boards) are on the sections 32 of the table 31 and during the normal processing cycle of carriers 80, in synchronous assembly line fashion.

Referring now to FIGS. 15, 16 and 17, a fifth type circuit board 820 is shown, with many different components of a variety of shapes and heights relative thereto, some of which must be coated by a masking coating and others by a conformal coating. These include circuit elements 821, product connectors 822, integrated circuits 823, pin connectors 824, lamp sockets 825, edge connectors 826 and right angle intake connectors 827.

Heretofore, circuit board 820 was conformal coated by dipping it in a coating bath to the full depth D to coat elements 821 and integrated circuits 823, and then curing the coating. As product connectors 822, pin connectors 824, lamp sockets 825, edge connectors 826 and intake connectors 827 must be protected from contact with the bath, a masking coating was first applied to such parts, and then cured. After applying the conformal coating to the masked circuit board 820, and curing the conformal coating, the underlying the masking coating was stripped.

This cumbersome operation is avoided by the invention, as a circuit board 820 may be loaded, sensed, coated and unloaded at rapid rate under precise conditions using apparatus 30, operated by suitably programmed control means 170. Only predetermined portions 87 requiring a coating 90 are coated, eliminating the separate masking process needed in the past to premask those areas not be coated with a conformal coating.

Referring now to FIGS. 18, 19 and 20, a sixth type circuit board 830 is shown, with many different components of a variety of shapes and heights relative thereto, some of which must be coated by a masking coating and others by a conformal coating. These include a display 831, circuit elements 832, integrated circuits 833, tooling holes 834, lamp sockets 835, key pads 836 and pins 837 (FIG. 18).

Heretofore, circuit board 830 was conformal coated by dipping it in a coating bath to the partial depth DD to coat elements 832, integrated circuits 833 and pins 837, and then curing the coating. As display 831, tooling holes 834, lamp sockets 835 and key pads 836 must be protected from contact with the bath, a separate masking coating was first applied to such parts, and then cured. After applying the conformal coating to the masked circuit board 830, and curing the conformal coating, the underlying the masking coating was stripped.

This equally cumbersome operation is avoided by coating a circuit board 830 according to the invention.

Referring now to FIGS. 21, 22 and 23, a seventh type circuit board 840 is shown, with many different components of a variety of shapes and heights relative thereto, some of which must be coated by a masking coating and others by a conformal coating. These include a display 841, a pin connector 842, an integrated circuit 843, circuit elements 844, tooling holes 845, lamp sockets 846, key pads 847 and pins 848 (FIG. 21). Integrated circuit 843, elements 844 and pins 848 must be conformal coated, whereas display 841, pin connectors 842, tooling holes 845, lamp sockets 846 and key pads 847 must not be conformal coated.

Due to its intricate component arrangement, circuit board 840 cannot be dip coated as a practical matter. Heretofore, it was conformal coated manually with a paint brush, to avoid the difficult masking of the components that must not be coated.

This previously manually brush coated type circuit board 840, in particular, is efficiently coated selectively with a conformal coating, without the need for a preliminary masking coating, using apparatus 30 according to the invention.

In all cases, according to the invention, the circuit board may be coated selectively to provide a uniform coating on predetermined portions 87 of one side when it is located on right holder 82 of its carrier 80 in a first cycle. Upon being turned over to locate it on left holder 83 of its carrier 80 at load-unload station 36 (FIG. 7), the circuit board may be coated selectively to provide a uniform coating on predetermined portions 87 of the opposite side in a second cycle. This eliminates a separate masking step prior to a conformal coating dipping step, or use of manual brush coating.

Where a conformal coating is used, the material in pot 150 may be a viscous, curable silicone liquid material, such as "100% Solids Silicone Conformal Coating, RTV Silicone product type, Formula No. X-125457" (Loctite Corp., Newington, Conn.), containing 95-100% polysiloxane, 0.1-1% photoinitiator: CAS No. 6175-45-7, 0.1-1% photoinitiator: CAS No. 7473-98-5, and 0.1-1% titanium derivative: CAS No. 546-68-9.

Typically, at a delivery pressure of up to 200 psig in tank 151, a pattern width of 0.20" of conformal coating material can be applied by spray gun 131 onto predetermined portions 87 of the circuit board where spray nozzle 132 is spaced not more than about 4" from the circuit board, and the flow rate is 0.03 gal/min. or 0.04 gal/min., depending on the nozzle 132 used.

where a masking coating is used, the material in pot 150 may be a water insoluble, curable silicone oil material, such as "Dow Corning (R) X3-6228 UV Masking Material" (Dow Corning Corp., Midland, Mich.).

Using a ½" width spray nozzle 132 to provide a ½" width and 3/32" thickness material ribbon, at a robot (moving means 133) dispense speed of 15"/sec, controlled by a delivery pressure of about 200 psig in tank 151, a flow rate of 0.703125 in³/sec or about 10.96 gal/hr of masking material can be dispensed by spray gun 131. Using a ¼" width spray nozzle 132 under such conditions, the flow rate can be about 2.74 gal/hr.

In these cases, the temperature of heater 156 is typically kept at about 100°-300° F. (38°-149° C.).

In one preferred embodiment, spray nozzle 132 is provided with a variable ejection opening capable of dispensing coating material 149 at a viscosity of about 50-300 CPS in a ribbon width variable from about ¼" to 1", e.g., at an accuracy of about ±0.020", or in an even smaller ribbon width of about 1/16", e.g., at that same accuracy, such as by providing the nozzle with a vertical distance adjustment. For such purposes, the delivery pressure in tank 151 is correspondingly adjustable between about 0-30 PSIG, and the temperature of heater 156 is correspondingly adjustable between about 70°-120° F. (21°-49° C.).

Maskant material for conformal coating is usually extremely viscous and dries to a very rubbery texture of considerable cohesive strength. This characteristic is desired for easy removal of the maskant material after the protective conformal coating has been applied. Ideally, the maskant material should come off in one manual pull when stripping the maskant coating to separate it from the circuit board.

If it is applied to all the irregular areas of the board that contain circuit components of various shapes and heights, i.e., over nooks and crannies on the board, it is usally applied in a thickness of approximately ⅛". On curing, this gives the maskant coating sufficient cohesive strength. Thus, once one starts pulling on the maskant material, i.e., after the conformal coating has been applied and cured, the masking material will readily pull away and peel from the board and its contained components in one single piece, even from the nooks and crannies. This is desirable for minimizing production costs, and is achievable with apparatus 30 according to the invention.

On the other hand, if an essentially flat surface on the board is to be coated, a coating of only about 1/16" may be needed according to the invention to provide sufficient cohesive strength for it to be pulled away in one piece from the board.

Significant to the development, use and operation of the system for performing related operations on workpieces as disclosed and claimed herein, is the discovery that a conformal coating or mask coating could be developed that would cure in a stationary position by diffused ultraviolet light. Heretofore, focused ultraviolet light was used to cure conformal coatings or mask coatings. Focused ultraviolet light must be moved relative to the coated circuit board or vice versa. If focused ultraviolet light is directed onto a stationary coated circuit board, the light will damage the coating, burn a hole through the circuit board and reflow of solder, thus destroying the workpiece.

Figure 27:
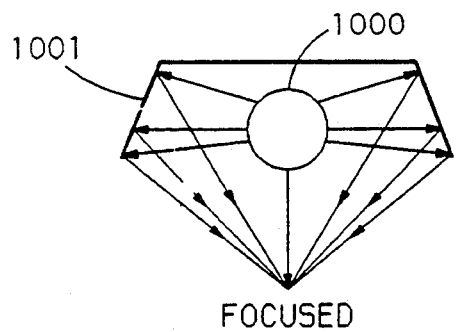
FIG. 27 illustrates "focused ultraviolet light."
Figure 28:
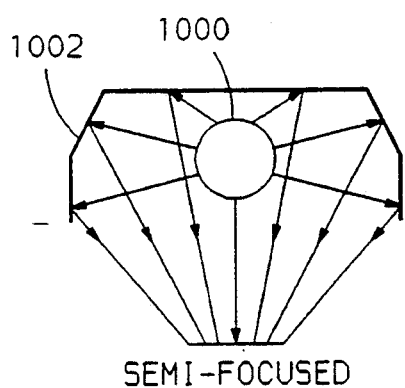
FIG. 28 illustrates "semi-focused ultraviolet light."
Figure 29:
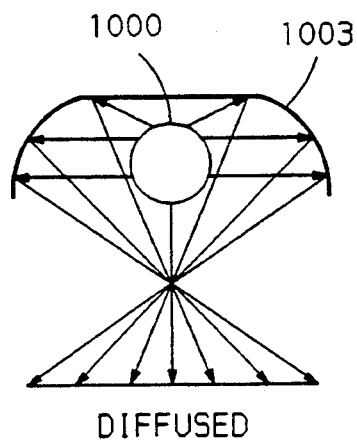
FIG. 29 illustrates "diffused ultraviolet light."

FIGS. 27-29 do not accurately depict the shapes of actual reflectors used to produce focused light, semi-focused light or diffused light and are for illustration purposes only. FIG. 27 illustrates "focused ultraviolet light" produced by an ultraviolet lamp 1000 that emits light that reflects off of a reflector 1001 to a single focused line of points having a width of about one inch or less. Focused light is directed to a single point or line of points thus necessitating the movement of the light relative to the circuit board or vice versa to cure the coating over an extended area of the circuit board. FIG. 28 illustrates "semi-focused ultraviolet light" produced by an ultraviolet lamp 1000 that emits light that reflects off of a reflector 1002 to focus the light on a "band" which is about three to five inches in width.

Figure 30:
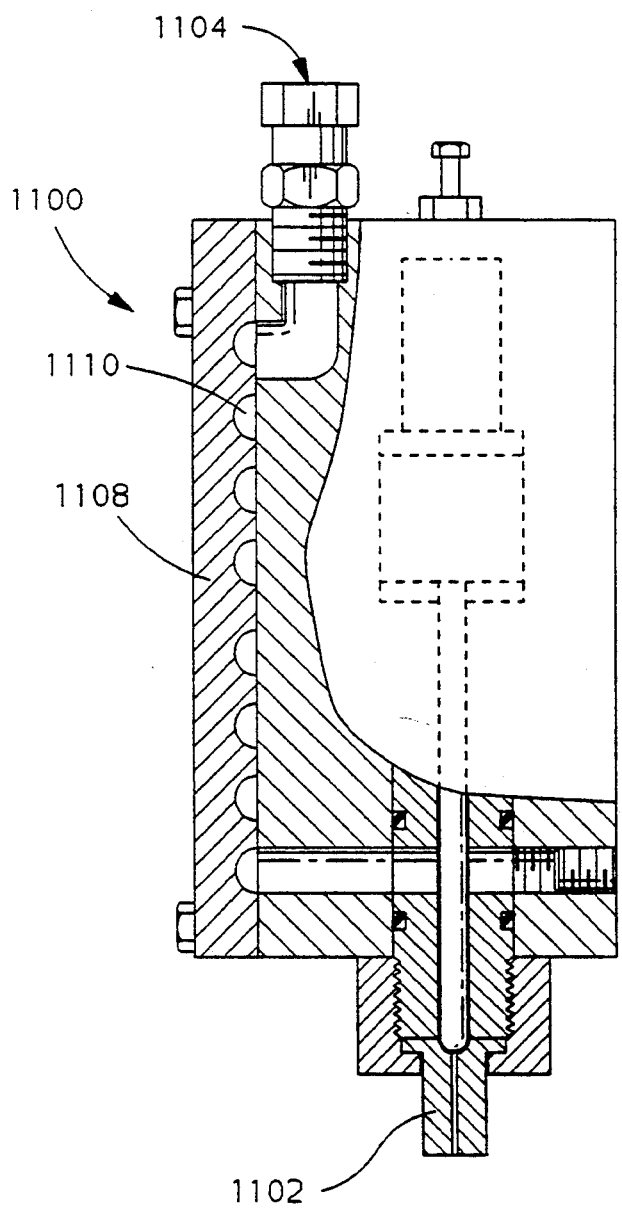
FIG. 30 illustrates a dispensing sun according to the present invention.

FIG. 29 illustrates "diffused ultraviolet light" produced by an ultraviolet lamp 1000 that emits light that reflects off of a reflector 1003 so that the light is scattered in all directions to create a wide curing area. Unlike focused or semi-focused light, diffused light provides a uniform ultraviolet light intensity and heat intensity over a very wide work envelope. The diffused ultraviolet light not only allows for the curing of a conformal coating on a stationary board but also provides for curing of at least a portion of the coating under components due to the scattering of the light. The invention includes the combination of a conformal coating of mask coating that can be easily and accurately dispensed onto a circuit board and the use of diffused ultraviolet light to cure the coating while the circuit board is in a stationary position. The requirements of and structure of the dispensing means of the present invention are described elsewhere in this application and Applicant's copending application U.S. Ser. No. 07/661,565 now abandoned and the continuation-in-part filed on U.S. Ser. No. 07/661,565. U.S. Ser. No. 07/811,873, filed Dec. 19, 1991, now U.S. Pat. No. 5,240,746, and both commonly assigned the written descriptions of which are hereby incorporated by reference. Briefly, the material must be precisely heated to about 160° F.±2° F. to control the viscosity of the material. The material is heated in the dispensing gun just prior to dispensing. Heating the material reservoir is likely to degrade the material. However, it is possible to heat the hose from the reservoir to about 100° F. and gradually increase the temperature of the materials in the delivery line to near the actual dispensing temperature. The material is heated so that it has a viscosity sufficient to dispense the material. FIG. 30 illustrates a dispensing gun 1100 according to the invention which includes a dispensing nozzle 1102, a coating inlet 1104, a valve 1106 for selectively dispensing the coating, and a heating plate 1108 to accurately heat the coating material to the desired temperature just prior to dispensing. A coating conduit 1110 is formed in the heating plate. The gun includes a means for controlling the heat generated from the heating plate, and means for actuating the valve in a manner known in the art.

Heretofore, 100 percent solid materials had never been dispensed from a nozzle apparatus to coat a circuit board with a conformal coating or mask coating. In prior methods, solvents had to be added to reduce the viscosity of such coatings to a dispensable level. The discovery of the above-described combination eliminates the need to remove the circuit board from the assembly line for coating in expensive, isolated, production floor consuming dip tanks. Many, but not all, dip tank coating compositions have high volatile organic compound (VOC) emissions that must be isolated from the rest of the production facilities due to pollution problems and the potential for explosions. Further, the dipping process is extremely long, messy and requires an operator to remove the circuit board from the dipping apparatus. Still further, the dip coating process wastes enormous amounts of coating material because all dip processes have a drop off region or section. A large amount of material drips off immediately after the material emerges from the dip tank use is not recoverable. Further, a large amount of material drips off in the oven from the underside of the circuit board. Finally, in the dip coating process it is difficult to maintain process control due to the uncontrollable variables associated with a large open vat of material.

The discovery of the above-described combination eliminated the need to use conveyor belt type focused ultraviolet light ovens which consume large amounts of production floor space and require the circuit board to be passed through the oven twice in order to cure the coating on both sides of the circuit board. In the prior art processes, the circuit board is usually coated on both sides and then sent to the curing operation. This prior art process causes serious dewetting on the side of the circuit board that is not cured first. Further, when the coated circuit board is placed on the conveyor belt of the oven, sometimes the parts must be propped up to prevent the coating on the side not being cured from sticking to the belt thus removing a portion of the coating from the circuit board and causing production problems. The propping up of the circuit board is labor intensive and time consuming. Most importantly, the conveyor belt mechanisms of the prior focused ultraviolet light curing conformal and mask coating processes were not amenable or suitable for use in a "dial" processing apparatus.

The present invention includes the discovery or realization that conveyor belt focused ultraviolet light ovens are not required to cure conformal or mask coatings. Further, the present invention includes the discovery or realization that a conformal or mask coating could be developed that could be cured by diffused ultraviolet light in a stationary position and the discovery or realization that such would make the step of curing conformal or mask coatings amenable or suitable to use in a "dial" processing apparatus. Still further, the present invention includes the discovery, realization and development of conformal and mask coatings which can be cured by diffused ultraviolet light in a stationary position. The present invention was arrived at by a multitude of nonobvious conceptual leaps in directions opposite that of the prior processes using physically isolated dip tanks and conveyor belt focused ultraviolet light ovens.

The dial apparatus of the present invention is placed directly in the production line consuming little floor space and so that continuous, uninterrupted, synchronous flow of the circuit board through the production line is provided. In the present invention, the conformal coating is accurately deposited on the circuit board at one station and cured in a stationary position at another station. Then the circuit board is flipped over and the process repeated to coat and cure the other side of the circuit board. The process of the present invention is fast, clean and accurate. By way of example, a circuit board can be conformal coated and cured on both sides using a solvent based, dip coating system and cured in a conveyor belt heat cured oven in 45–50 minutes, compared to the present system which will be able to coat and cure a conformal coating on a circuit board in about two minutes or less. The present invention eliminates the extensive and time consuming masking steps needed for dip coating processes.

A typical spray gun 131 is the "Aro Flow Gun, Part No. 407444" (Aro Corp., Bryan, Ohio), e.g., with a spray nozzle 132 of 0.3 mm (0.012"), 0.5 mm (0.020") or 0.7 mm (0.028") diameter size. The nozzle size is usually selected at least in part in relation to the viscosity of the coating material being spray dispensed. Spray gun 131 is desirably provided with a quick disconnect mounting, enabling one size or type spray gun to be readily exchanged for another. Spray nozzle 132 is desirably interchangeable with others of different size and shape openings.

A typical 5-axis robotic moving means 133 (robot) is the "AdeptOne Manipulator" (Adept Technology, Inc., San Jose, Calif.).

A typical motor 70 moving means arrangement (table indexer) is the "Camco Indexer, #902 ROM 4H32-330" (CAMCO, Wheeling, Ill.), having a 1HP motor (permanent magnet DC type) and a "R250" reducer (@50:1 reduction), and a "Camco #7.8D" overload clutch.

Typical type sensors 101 are "Banner Photo Cells, micro switch type proximity sensor #923AA3W-A7T-L" (Banner Engineering Corp., Minneapolis, Minn.). Typical orientation sensors 102, 103 and retro-reflectors 106, 107 are "Banner Photo Cells, mini-beam sensor #SM 312 LV⇌ and "Banner Retro-reflectors #BRT 2".

Typical light curtain screen means 180 and light curtain screen means 190 are those designated "Light Curtains" (Scientific Technologies, Inc., Mountainview, Calif.).

As an example of the sequence of operations of apparatus 30 with four sections (quadrants) 32 on table 31 successively moved in intervals (indexed) by motor 70 to each of load-unload station 36, sensing station 37, work station 38 and counterpart load-unload station 39, e.g., for conformal coating of circuit boards on dedicated pallets, the following steps are effected.

The operator at load-unload station 36 (operator station, 0° index) loads and unloads circuit boards on dedicated pallets in random order onto the respective sections 32.

If the operator is clear of curtain beam 193, table 31 indexes each section 32 successively to sensing station 37 (pallet read station, 90° index), for sensing (reading) pallet type and circuit board presence, and circuit board type and orientation, and transmitting the "read" information to the programmable dispense system constituted by control means 170 and work performing means 130.

If the operator is clear of curtain beam 193, table 31 next indexes each section 32 successively to work station 38 (automatic programmable coat/mask dispense or coating station, 180° index), for dispensing the coating material on the corresponding circuit board based on the information previously sensed at sensing station 37.

If the operator is clear of curtain beam 193, table 31 then indexes each section 32 to counterpart load-unload station 39 (supplemental operator station, 270° index), and in turn back to load-unload station 36, as earlier discussed.

The cycle time of table 31 will vary due to the fact that it will not index (automatically) until all stations are in "home" position, i.e., until all operations at each station are completed, spray gun 131 is retracted and the operator has finished pallet unloading and reloading, or turning over of a circuit board from one of holders 82 and 83 to the other.

If a second operator is used at counterpart load-unload station 39, the routine is modified, as earlier described.

The above routine is effectively carried out with a 4-stop drive (e.g., DC) indexed motor 70 arrangement, preferably having cam switches (not shown) for precise control of the 90° increments of stepwise movement of table 31 (e.g., of about 48" diameter) in relation to its four quadrant sections 32, to rotate table 31 rapidly, e.g., in a maximum of 2 seconds for each 90° increment. Receiving means 40 are accurately located on each section 32, and holders 82 and 83 are accurately located on each pallet, to assure that each circuit board is properly aligned for sensing at sensing station 37 and coating at work station 38.

Where only one operator is used, table 31 may be divided into three sections 32 of common size and shape, instead of four, with motor 70 arranged to rotate table 31 in 120° increments, for otherwise comparable operation of apparatus 30.

Apparatus 30 constitutes a compact automatic masking or conformal coating machine that occupies a minimum of floor area in a work place, thus reducing capital and other costs. At the same time, it represents an assembly line installation for performing work in-line on workpieces, such as the coating of circuit boards, in random order, due to the specific rotary table and station arrangement. An essentially reject-free, high throughput product fabrication is achievable because of the operation of such arrangement in conjunction with programmable control means under operator attendant overriding control.

Apparatus 30 is flexible in that it is usable to coat all types of circuit boards. Separate machines are not needed to coat separate types of circuit boards as in the past. It is also flexible in that it can accommodate a different type circuit board at each station, so that several different types of circuit boards can be processed at the same time.

Separate operations are simultaneously conducted at load-unload station 36, sensing station 37 and work station 38 of apparatus 30, rather than in time consuming sequential tandem steps at a sole station. One board may be loaded, while another is being sensed and a third undergoing work, with each being either the same type or a different type relative to the others, as well as in the same or a different orientation (component side up/solder side down, or solder side up/component side down) from each of the others. These features are attained in uninterrupted on-line operation of apparatus 30, with no change in setting needed to switch from one product (board) to another.

Apparatus 30 permits a diversity of circuit board products (parts) to be coated automatically, after they are manually loaded and the machine activated, including the coating of a variety of components of differing shapes and heights relative to the board surface, such as edge board connectors, both male and female connectors, mounting holes, display glass, and the like.

The versatility of the kind of work that can be performed on the workpieces 81 by apparatus 30, as typified above, enables the arrangement to be positioned in an desired spatial orientation for further conserving floor space in the work place. For instance, by way of modification, table 31 can be mounted for rotation about a horizontal axis (akin to an amusement park ferris wheel), or about an axis at an angle to the vertical, rather than about a vertical axis as depicted in FIG. 1.

In such modification, using a single operator, load-unload station 36 can be located at operator (floor) level, sensing station 37 and counterpart load-unload station 39 at a common raised level, and work station 38 at a still higher raised level, to conserve even more floor space by use instead of otherwise unused height. While the floor space of a work place is usually at a premium, its height is normally not fully exploited. This modification exploits the height more fully and simultaneously conserves floor space. The conserved space may be used to place a conveyor 200 more compactly thereat.

While table 31 is shown with a circular shape, it may have any other suitable shape, such as a polygonal, e.g., pentagonal, hexagonal, etc., shape, so long as its periphery 35 does not interfere with sensing means 100, work performing means 170, or the free movement of any attending operator. Also, while support 50 is shown carrying both table 31 and work performing means 130, work performing means 130 may be on a separate support adjacent support 50 at work station 38.

Instead of holes 88 on each carrier 80, other indicator means can be used for sensing by type sensors 01, such as bar code labels (not shown) as used on retail product items, specific pattern shapes (not shown), etc., that are readable by sensors 101. For instance, a bar code label may be located in the same area occupied by holes 88 on each carrier 80, or each type carrier 80 may be provided with an edge portion in that same area having a specific pattern shape indigenous to that type carrier.

These alternative forms of indicator means can also be located instead in suitable positions on the workpiece 81 itself, rather than on its associated carrier 80. Specifically, a bar code label indigenous to the given type circuit board may be located on an edge portion on each side of the board that is aligned with the beams of appropriately aimed type sensors 101 when the board is in the corresponding right or left orientation on its carrier 80, where that edge portion is otherwise unused and does not interfere with the work being performed, e.g., the spray coating operation. Also, that edge portion of the given type circuit board may have a specific pattern shape indigenous to that type circuit board that can serve as indicator means.

In all these cases, the same result is achieved, to wit, identifying at sensing station 37 the particular type workpiece 81 and calling up the proper program in control means 170 for performing the contemplated work thereon at work station 38.

Carriers 80 may have conventional adjustment means and adapters as used to convert a commercial universal type carrier (pallet) to a dedicated or distinctive form corresponding to any of pallets 801, 802, 803 or 804. Such adjustment means and adapters may be used to adjust and adapt the latches 84 and stops 85 of the right holder 82 and left holder 83 of a universal type carrier to hold a given one of the different type circuit boards 811, 812, 813 or 814 as a thereby adjusted dedicated pallet 801, 802, 803 or 804. Instead of holes 88, the universal type carrier 80 may have other indicator means such as a bar code label, or the indicator means may be on the workpiece 81, as noted above.

Apparatus 30 is advantageously usable to apply selectively a coating to predetermined portions 87 (areas) of a circuit board, such as a curable viscous maskant material, just prior to the blanket coating of the board with a conformal coat. It is equally usable to apply selectively a conformal coat on an electronic circuit board without prior masking of pertinent components, because of the precise manner in which the coating material 149 can be sprayed onto the predetermined portions 87 without overspraying adjacent portions (areas) not to be coated.

A critical aspect of the invention is that it provides a flexible machine unit (apparatus 30) that can be installed in-line, e.g., in a circuit board manufacturing area, without taking up much floor space. It is "flexible" in that workpieces 81 are automatically processed on a dial machine (table 31) in random order, despite their individually differing types, because of the use of automatic sensing means 100 in conjunction with automatic work performing means 130 programmed by control means 170 to operate on the random order workpieces 81 in dependence upon the workpiece sensing previously effected by sensing means 100.

At the same time, the flexible machine unit (apparatus 30) is advantageously selective in that it can be used not only to apply a maskant type coating for after-applied conformal coatings, but also to apply the conformal coating itself.

In one commonly used procedure, when the entire solder side of the workpiece 81 (circuit board) must be coated, while only selective portions of its component side are to be coated, it is first placed on the left holder 83 (solder side up, component side down) and completely coated in a first cycle of table 31. Then, the workpiece 81 is flipped over and placed on the right holder 82 (component side up, solder side down) and selectively coated on predetermined portions 87 thereof in a further cycle.

It will be apparent that apparatus 30 may be used to perform other kinds of work on workpieces 81 than the coating of circuit boards, such as the spray painting, embossing, stamping, etc., of other products, e.g., automotive or other parts, in random order.

It will also be apparent that each carrier 80 can have more than two holders, for holding its type workpiece 81 in additional orientations. For instance, in addition to holders 82 and 83 that respectively hold a horizontally positioned, generally two dimensional monoplanar workpiece 81 (circuit board) in top and bottom side orientations, each carrier 80 may have one or more further holders to hold such monoplanar workpiece 81 in vertical position to present one or more edge portions thereof to an appropriately programmed spray nozzle 132 at work station 38 after sensing the respective further orientation by appropriately arranged sensing means 100 at sensing station 37.

Also, carriers 80 can have more than two holders to hold a generally three dimensional multi-planar shaped workpiece 81, such as an automobile hood, fender, trunk lid, bumper, etc., in more than two orientations to present different portions thereof respectively to an appropriately programmed spray nozzle 132 at work station 38 after sensing the respective orientation by appropriately arranged sensing means 100 at sensing station 37, in successive cycles of table 31. Thus, a first portion of the multi-planar workpiece 81 may be processed in a first cycle, a second (different) portion thereof processed in a second cycle, a third (still different) portion processed in a third cycle, etc.

For large, bulky product, workpieces 81, several operators may be needed to manipulate them at load-load station 36. Whether the workpiece 81 is manually manipulatable by one operator or requires several operators, conventional automatic programmable robotic means may be used at load-unload station 36 to effect such manipulation, under operator guidance.

Work performing means 130 may be programmed by sensing means 100 and control means 170 to perform work on two workpieces 81 in side-by-side arrangement on holders 82 and 83 on a carrier 80 during their common stay at work station 38 in one cycle.

Alternatively, two separate work performing means 130 may be provided at work station 38 to perform work respectively on two workpieces 81 in side-by-side arrangement on holders 82 and 83 on a carrier 80 during their common stay at work station 38 in one cycle. For instance, two moving means 133 correspondingly moving two spray guns 131 for respectively coating two circuit boards simultaneously, may be arranged at work station 38. Each moving means 133 will be programmed by sensing means 100 and control means 170 to move its spray gun 131 only in the area adjacent its corresponding circuit board, so that the two spray guns 131 do not interfere with each other, yet precisely coat the desired predetermined portions 87 on their respective circuit boards.

If work is performed on both sides (faces) of the two side-by-side workpieces 81, they may be relatively switched on holders 82 and 83 after the first cycle, for second cycle processing.

Referring now to FIGS. 24, 25 and 26, the carriers 80 may be formed as a reversible pallet 901 with two side-by-side through apertures such as a right aperture 902 and a left aperture 903 as right and left holding means, shaped and sized to contain two side-by-side associated type workpieces 81 formed as circuit boards 850, held by top side releasable clips 904 and reverse side ledges 905. As shown in FIG. 24, the top sides of circuit boards 850 having components 86 are exposed when the top side of pallet 901 faces upwardly on the receiving means of a table section 32, for processing in one cycle. Pallet 901 is then flipped over (front to back) on the receiving means to expose its reverse side, as shown in FIG. 25, to process the bottom sides of circuit boards 850 in a further cycle. Pallet 901 has a first (inner edge) series of holes 88 for sensing when its top side is exposed, and a second (outer edge) different series of holes 88 for sensing when its reverse side is exposed.

As shown in FIG. 26, the circuit boards 850 may be more or less flush with the adjacent surfaces of pallet 901 at the edges of apertures 902 and 903, and stationarily held from below by ledges 905 when in face up (first) orientation (FIG. 24) and by clips 904 when in face down (second) orientation (FIG. 25).

Pallet 901 is used to process one side of both circuit boards 850 in one cycle or both sides of both circuit boards in two cycles per intervening reversal of pallet 901 on its section 32 of table 31. Each pallet 901 is dedicated to its associated type circuit board 850 by its apertures 902 and 903 that are complemental to the circuit board shape and size.

In a random mixture operation embodiment, using apparatus 30 with carriers 80, formed of pallets 801, 802, 803 and 804, having holders 82 and 83 to hold workpieces 81, formed of circuit boards 811, 812, 813 and 814, in two alternative orientations, e.g., one face up (component side up, solder side down) on left holder 83 and one face down (solder side up, component side down) on right holder 82, the sensing and processing operations may be effected randomly, with a matching preset random mixture supply, e.g., via conveyors, of preloaded pallets and of circuit boards alone.

Assuming that a pallet 801 with a processed circuit board 811 has just reached load-unload station 36, the operator may remove only the circuit board 811 from the pallet 801 and replace it with a fresh circuit board 811 on either right holder 82 or left holder 83 of that same pallet 801 for sensing and processing in the next cycle. If both sides of the fresh circuit board 811 are to be processed, at the end of the next cycle the fresh circuit board 811 may be flipped over and switched to the other of holders 82 and 83 of the same pallet 801 for sensing and processing in a further cycle. This circuit board loading and unloading, and intervening switching from one to the other holder, of a pallet that remains in place on table 31, may be performed by the operator for each pallet as it arrives at load-unload station 36. The operator may instead unload the pallet and its processed circuit board, and load another pallet holding a circuit board for sensing and processing in the usual way.

As the sensing and processing steps are automatic, using apparatus 30 as above described, the operator may be guided by the next delivered matching preset random mixture supply item as to whether to unload the pallet and its processed circuit board and load in its place on table 31 the next random order pallet holding a fresh circuit board to be processed, or to unload only the processed circuit board and load in its place the next of the same type on the pallet which remains in place on table 31.

This random mixture operation may also be used to process two circuit boards at the same time, when side-by-side on the holders 82 and 83 of a pallet. For instance, in a preliminary step, after a first cycle in which a single, first circuit board on holder 82 of the pallet is processed on one side, it is flipped over and switched to holder 83 and a fresh, second circuit board loaded on holder 82, while the pallet remains in place on table 31. In a full step, after the second cycle, the first circuit board is removed from holder 83, the second circuit board flipped over and switched to holder 83, and a fresh, third circuit board loaded on holder 82, while the pallet remains on table 31. After the third cycle, the full step can be repeated.

This incremental loading and unloading procedure for side-by-side circuit board processing on the same pallet at the same time, may be individually performed by the operator for each pallet as it randomly arrives at load-unload station 36. In each case, the operator may instead unload the pallet and its processed circuit board as it arrives at load-unload station 36 and load another random order pallet holding a circuit board, or side-by-side circuit boards, for processing as above described.

Accordingly, it can be appreciated that the specific embodiments described are merely illustrative of the general principles of the invention. Various modifications may be provided consistent with the principles set forth.

The embodiments of the invention in which an exclusive property or privilege is claimed are defined as follows:

1. Apparatus for performing work on workpieces of different types in random order in assembly line fashion, the apparatus comprising:
  a rotary table comprising circumferentially spaced apart table sections, and having a rotator for rotating the table stepwise to move each table section in cycles at intervals from a load-unload station to a sensing station, then to a work station and in turn back to the load-unload station;
  a plurality of at least two different types of carriers receivable in random order respectively on the table sections, each type carrier being distinctive for carrying an associated type of workpiece different from that of each of the other types of carriers, and having a receiver for holding such an associated type workpiece in at least two different alternative orientations for performing work on respectively portions thereof in each orientation;
  a sensor for sensing the type and orientation of a workpiece held on a carrier on a respective table section at the sensing station;
  a device for performing work on said portions of a workpiece held in a said orientation on a respective table section at the work station, the device being operated in dependence upon the workpiece type and orientation previously sensed at the sensing station; and
  a controller for controlling the rotator, sensor and the device for interval stepwise operation, to permit loading and unloading of the carriers in random order respectively onto and from the table sections at the load-unload station, workpiece type and orientation sensing at the sensing station, and portion workpiece work performing at the work station, between stepwise movements of the table sections.

2. The apparatus of claim 1 wherein said receiver is constructed to hold a circuit board.

3. The apparatus of claim 1 wherein each table section has receiving means for receiving a respective carrier thereon.

4. The apparatus of claim 1 comprising a workpiece type indicator associated with each carrier for indicating the associated type workpiece and arranged for sensing by the sensor when the carrier is on a table section at the sensing station.

5. The apparatus of claim 1 wherein each receiver comprises a first holder for holding an associated type workpiece in a first orientation for performing work on first portions thereof, and a second holder for holding an associated type workpiece in a second orientation for performing work on second portions thereof.

6. The apparatus of claim 5 wherein:

the first holder is arranged for holding the workpiece such that a portion thereof occupies a first region relative to the carrier, and the second holder is arranged for holding the workpiece such that a portion thereof occupies a second region relative to the carrier which is distinct from the first region; and the sensor comprises a signal beam projector for projecting a first beam along a first sensing path intersecting the first region when the workpiece is in said first orientation on the carrier on a table section at the sensing station, and for projecting a second beam along a second sensing path intersecting the second region when the workpiece is in said second orientation on the carrier thereat, whereby a workpiece in a said orientation on an associated carrier at the sensing station interrupts the corresponding beam for sensing its orientation.

7. The apparatus of claim 1 wherein:
the device comprises:
a dispenser comprising a movable nozzle for dispensing a flow of coating material; and
a driver for moving the nozzle along a first coating path for coating the dispensed coating material selectively onto first portions of a workpiece in a first said orientation on an associated carrier on a table section at the work station, and alternatively along a second coating path for coating the dispensed coating material onto second portions of the workpiece in a second said orientation on the carrier on a table section at the work station, in dependence upon the workpiece type and orientation previously sensed at the sensing station; and
the controller controls the dispenser and driver for interval stepwise operation to permit portion workpiece coating at the work station, between stepwise movements of the table sections.

8. The apparatus of claim 7 in combination with corresponding associated workpieces comprising circuit boards, each having first and second sides, each holder being arranged for holding an associated type circuit board in a first orientation such that the first side of the circuit board is exposed for coating first portions thereof, and alternatively in a second orientation such that the second side thereof is exposed for coating second portions thereof.

9. The apparatus of claim 7 wherein the driver is arranged to move the nozzle in a generally horizontal linear first direction, in a generally horizontal linear second direction crosswise of the first direction and in a generally vertical linear third direction.

10. The apparatus of claim 9 wherein the driver is further arranged to move the nozzle in a rotational fourth direction about a generally vertical axis and in a rotational fifth direction about a generally horizontal axis.

11. The apparatus of claim 1 wherein the controller is arranged for controlling the rotator, sensor and device for interval stepwise automatic operation, to permit loading and unloading of the carriers in random order respectively onto and from the table sections at the load-unload station, automatic workpiece type and orientation sensing at the sensing station, and automatic portion workpiece work performing at the work station, between automatic stepwise movements of the table sections.

12. Apparatus for coating workpieces of different types in random order in assembly line fashion, the apparatus comprising:
a rotary table comprising circumferentially spaced apart table sections, and having rotating means for rotating the table stepwise to move each table section in cycles at intervals from a load-unload station to a sensing station, then to a coating station and in turn back to the load-unload station;
a plurality of at least two different types of carriers receivable in random order respectively on the table sections, each type carrier being distinctive for carrying an associated type of workpiece different from that of each of the other types of carriers, and having holder means for holding such an associated type workpiece in a first orientation for coating first portions thereof, and alternatively in a second orientation for coating second portions thereof;
receiving means on each table section for receiving a respective carrier thereon;
sensing means for sensing the type and orientation of a workpiece held on a carrier on a respective table section at the sensing station;
dispensing means comprising a movable nozzle for dispensing a flow of coating material;
moving means for moving the nozzle along a first coating path for coating the dispensed coating material onto said first portions of a workpiece in said first orientation on an associated carrier on a respective table section at the coating station, and alternatively along a second coating path for coating the dispensed coating material onto said second portions of the workpiece in said second orientation thereon at the coating station, in dependence upon the workpiece type and orientation previously sensed at the sensing station; and
control means for controlling the rotating means, sensing means, dispensing means and moving means for interval stepwise automatic operation, to permit loading and unloading of the carriers in random order respectively onto and from the table sections at the load-unload station, automatic workpiece type and orientation sensing at the sensing station, and automatic portion workpiece coating at the coating station, between automatic stepwise movements of the table sections.

13. The apparatus of claim 12 wherein each holding means is designed to hold a circuit board.

14. The apparatus of claim 12 comprising workpiece type indicator means associated with each carrier for indicating the associated type workpiece and arranged for sensing by the sensing means when the carrier is on a table section at the sensing station.

15. The apparatus of claim 12 wherein:
each holder means comprises a first holder for holding an associated type workpiece in said first orientation such that a portion thereof occupies a first region relative to the carrier, and a second holder for holding an associated type workpiece in said second orientation such that a portion thereof occupies a second region relative to the carrier which is distinct from the first region; and
the sensing means comprises signal beam projecting means for projecting a first beam along a first sensing path intersecting the first region when the workpiece is in said first orientation on the carrier on a table section at the sensing station, and for projecting a second beam along a second sensing path intersecting the second region when the workpiece is in said second orientation on the carrier thereat, whereby a workpiece in a said orientation on an associated carrier at the sensing station interrupts the corresponding beam for sensing its orientation.

16. The apparatus of claim 15 wherein each holder is constructed to hold circuit boards, each having first and second sides, each holder being arranged for holding an associated type circuit board in said first orientation such that the first side of the circuit board is exposed for coating first portions thereof, and alternatively in said second orientation such that the second side thereof is exposed for coating second portions thereof.

17. The apparatus of claim 12 wherein the moving means are arranged to move the nozzle in a generally horizontal linear first direction, in a generally horizontal linear second direction crosswise of the first direction and in a generally vertical linear third direction.

18. The apparatus of claim 17 wherein the moving means are further arranged to move the nozzle in a rotational fourth direction about a generally vertical axis and in a rotational fifth direction about a generally horizontal axis.

19. Apparatus for coating circuit boards of different types in random order in assembly line fashion, the apparatus comprising:
a rotary table comprising at least three circumferentially spaced apart table sections, and having a rotator for rotating the table stepwise to move each table section in cycles at intervals from a load-unload station to a sensing station, then to a coating station and in turn back to the load-unload station;
a plurality of at least two different types of pallets receivable in random order respectively on the table sections, each type pallet being distinctive for carrying an associated type of circuit board different from that of each of the other types of pallets;
a receiver on each table section for releasably stationarily receiving a respective pallet thereon;
a first holder on each pallet for releasably stationarily holding an associated type circuit board in a first orientation such that a first side of the circuit board is exposed for coating first portions thereof, and a second holder on each pallet for alternatively releasably stationarily holding an associated type circuit board in a second orientation such that a second side of the circuit board is exposed for coating second portions thereof;
a sensor for sensing the type and orientation of a circuit board held on a pallet on a respective table section at the sensing station;
a workpiece type indicator associated with each pallet for indicating the associated type circuit board and arranged for sensing by the sensor when the pallet is on a table section at the sensing station;
a dispenser comprising a movable nozzle for dispensing a flow of coating material;
a driver for moving the nozzle along a first coating path for coating the dispensed coating material onto said first portions of a circuit board in said first orientation on an associated pallet on a respective table section at the coating station, and alternatively along a second coating path for coating the dispensed coating material onto said second portions of the circuit board in said second orientation thereon at the coating station, in dependence upon the circuit board type and orientation previously sensed at the sensing station; and
a controller for controlling the rotator, sensor, dispenser and driver for interval stepwise automatic operation, to permit loading and unloading of the different type pallets individually in random order respectively onto and from the table sections at the load-unload station, automatic circuit board type and orientation sensing at the sensing station, and automatic portion circuit board coating at the coating station, between automatic stepwise movements of the table sections.

20. The apparatus of claim 19 wherein the workpiece type indicator is disposed on the pallet.

21. The apparatus of claim 19 wherein:
the first holder is arranged for holding the circuit board such that a portion thereof occupies a first region relative to the pallet, and the second holder is arranged for holding the circuit board such that a portion thereof occupies a second region relative to the pallet which is distinct from the first region; and
the sensor comprises signal beam projector for projecting a first beam along a first sensing path intersecting the first region when the circuit board is in said first orientation on the pallet on a table section at the sensing station, and for projecting a second beam along a second sensing path intersecting the second region when the circuit board is in said second orientation on the pallet thereat, whereby a circuit board in a said orientation on an associated pallet at the sensing station interrupts the corresponding beam for sensing its orientation.

22. The apparatus of claim 21 wherein the first and second holders on each pallet are arranged side by side to permit a circuit board initially held on one holder and coated on a first side at the coating station in one cycle to be turned over and placed on the other holder subsequently at the load-unload station for coating a second side of the circuit board at the coating station in another cycle.

23. The apparatus of claim 19 wherein the driver is arranged to move the nozzle in a generally horizontal linear first direction, in a generally horizontal linear second direction crosswise of the first direction and in a generally vertical linear third direction.

24. The apparatus of claim 23 wherein the driver is further arranged to move the nozzle in a rotational fourth direction about a generally vertical axis and in a rotational fifth direction about a generally horizontal axis.

25. The apparatus of claim 19 wherein the table comprises four circumferentially spaced apart table sections and has four correspondingly spaced apart stations adjacent the table sections, the fourth station constituting a counterpart load-unload station between the coating station and the load-unload station and remote from the sensing station, to permit pallet unloading at the counterpart load-unload station and pallet loading at the load-unload station, between stepwise movements of the table sections successively to the four stations.

26. A method for performing work on workpieces of different types in random order in assembly line fashion, the method comprising:
rotating stepwise at intervals a rotary table comprising circumferentially spaced apart table sections to move each table section stepwise in cycles from a load-unload station to a sensing station, then to a work station and in turn back to the load-unload station;

providing a plurality of at least two different types of carriers receivable in random order respectively on the table sections, each type carrier being distinctive for carrying an associated type of workpiece different from that of each of the other types of carriers, and being capable of holding the associated type workpiece in at least two different alternative orientations for performing work on respectively portions thereof in each orientation;

providing an associated type workpiece on each carrier in a said orientation; and carrying out therewith the following steps:
(1) loading in random order a carrier holding an associated type workpiece in a said orientation onto each table section, on stepwise movement of the respective table section to the load-unload station;
(2) sensing the type and orientation of the workpiece, on stepwise movement of the respective table section to the sensing station;
(3) performing work on said portions of the workpiece in the said orientation, on stepwise movement of the respective table section to the work station, the work being performed in dependence upon the type and orientation of the workpiece previously sensed at the sensing station;
(4) changing the workpiece from the said orientation to another orientation on the associated carrier, or alternatively unloading such carrier and loading in random order another carrier holding an associated type workpiece in a said orientation, on stepwise movement of the respective table section to the load-unload station to complete a cycle; and
(5) repeating said steps sufficiently to complete at least one further cycle.

27. The method of claim 26 wherein the steps are effected such that at least one of the cycles includes the step of changing of a workpiece from the said orientation to another said orientation on an associated carrier, and the repeating of the steps sufficiently to complete at least one further cycle.

28. The method of claim 26 wherein the step of performing work comprises coating a coating material onto said portions of the workpiece in the said orientation.

29. The method of claim 28 wherein the workpieces have first and second sides, and each workpiece is held on the associated carrier either in a first orientation such that the first side of the workpiece is exposed for coating first portions thereof, or alternatively in a second orientation such that the second side thereof is exposed for coating second portions thereof.

30. The method of claim 29 wherein the workpieces comprise circuit boards having a different pattern of circuit components on the first and second sides thereof.

31. The method of claim 30 wherein the coating material is a masking material for masking circuit components on a corresponding side of the circuit board.

32. The method of claim 31 wherein the coating material is a conformal coating material for sealing the circuit components on a corresponding side of the circuit board.

33. The method of claim 29 wherein the workpieces have opposed first and second sides, and the step of changing the workpiece from the said orientation to another orientation is effected by turning over the workpiece to expose the other corresponding side thereof.

34. The method of claim 26 wherein the step of changing the workpiece or alternatively unloading such carrier is effected manually, and the step of sensing the type and orientation of the workpiece, the step of performing work on said portions of the workpiece, and the rotating of the table stepwise at intervals are correspondingly effected automatically.

35. The method of claim 26 wherein the table comprises four sections and is rotated stepwise at intervals to move each table section stepwise in cycles successively from the load-unload station to the sensing station, then to the work station, then to a counterpart load-unload station and in turn to the load-unload station, the step of loading the carriers is effected at the load-unload station, the step of sensing the workpieces is effected at the sensing station, the step of performing work on the workpieces is effected at the work station, the step of changing the workpieces from one orientation to another orientation is effected at the load-unload station or alternatively at the counterpart load-unload station, and the selective step of unloading the carriers is effected at the counterpart load-unload station.

36. A method for coating circuit boards of different types in random order in assembly line fashion, the method comprising:

rotating stepwise at intervals a rotary table comprising circumferentially spaced apart table sections to move each table section stepwise in cycles successively from a load-unload station to a sensing station, then to a coating station and in turn back to the load-unload station;

providing a plurality of at least two different types of carriers receivable in random order respectively on the table sections, each type carrier being distinctive for carrying an associated type of circuit board different from that of each of the other types of carriers, and being capable of holding the associated type circuit board in a first orientation for coating first portions thereof, and alternatively in a second orientation for coating second portions thereof;

providing an associated type circuit board on each carrier in a corresponding one of said orientations; and carrying out therewith the following steps:
(1) loading in random order a carrier holding an associated type circuit board in a corresponding one of said orientations onto each table section, on stepwise movement of the respective table section to the load-unload station;
(2) sensing the type and orientation of the circuit board, on stepwise movement of the respective table section to the sensing station;
(3) coating a coating material onto said portions of the circuit board in the corresponding one of said orientations, on stepwise movement of the respective table section to the coating station, the coating being performed in dependence upon the type and orientation of the circuit board previously sensed at the sensing station;
(4) changing the circuit board from the corresponding one of said orientations to the corresponding other of said orientations on the associated carrier, or alternatively unlaoding such carrier and loading in random order another carrier holding an associated type circuit board in a corresponding one of said orientations, on stepwise movement of the respective table section to the load-unload station to complete a cycle; and (5) repeating said steps sufficiently to complete at least one further cycle;

the steps being effected such that at least one of the cycles includes the step of changing a circuit board from the corresponding one of said orientations to the corresponding other of said orientations on an associated carrier, and the repeating of the steps sufficiently to complete at least one further cycle.

37. The method of claim 36 wherein the coating material is a masking material.

38. The method of claim 36 wherein the coating material is a conformal coating material.

39. The method of claim 36 wherein the circuit boards have opposed first and second sides, and the step of changing a circuit board from a corresponding one of said orientations to the corresponding other of said orientations is effected by turning over the circuit board.

40. The method of claim 36 wherein the step of changing the circuit board or alternatively unloading such carrier is effected manually, and the step of sensing the type and orientation of the circuit board, the step of coating said portions of the circuit board, and the rotating of the table stepwise at intervals are correspondingly effected automatically.

41. The method of claim 40 wherein the table comprises four sections and is automatically rotated stepwise at intervals to move each table section stepwise in cycles successively from the load-unload station to the sensing station, then to the coating station, then to a counterpart load-unload station and in turn to the load-unload station, the step of loading the carriers is effected manually at the load-unload station, the step of sensing the circuit boards is effected automatically at the sensing station, the step of coating said portions of the circuit board is effected automatically at the work station, the step of changing the circuit board from a corresponding one of said orientations to the corresponding other of said orientations is effected manually either at the load-unload station or alternatively at the counterpart load-unload station, and the step of unloading the carriers is effected manually at the counterpart load-unload station.

42. A method for performing work on workpieces of different types in random order in assembly line fashion, which comprises:

rotating stepwise at intervals a rotary table comprising circumferentially spaced apart table sections to move each table section stepwise in cycles successively from a load-unload station to a sensing station, then to a work station and in turn back to the load-unload station;

providing a plurality of at least two different types of carriers receivable in random order respectively on the table sections, each type carrier being distinctive for carrying an associated type of workpiece different from that of each of the other types of carriers, and being capable of holding the associated type workpiece in at least two different alternative orientations for performing work on respectively portions thereof in each orientation;

providing a plurality of associated type workpieces for each carrier; and carrying out therewith the following steps:

(1) providing in random order a carrier holding an associated type workpiece in a said orientation on each table section, on stepwise movement of the respective table section to the load-unload station;

(2) sensing the type and orientation of the workpiece;

(3) performing work on said portions of the workpiece in the said orientation, on stepwise movement of the respective table section to the work station, the work being performed in dependence upon the type and orientation of the workpiece previously sensed at the sensing station;

(4) changing the workpiece from the said orientation to another orientation on the same carrier, or alternatively unloading such workpiece and loading on the same carrier another associated type workpiece in a said orientation thereon, on stepwise movement of the respective table section to the load-unload station to complete a cycle; and (5) repeating said steps sufficiently to complete at least one further cycle.

43. The method of claim 42 wherein the steps are effected such that at least one of the cycles includes the step of changing a first workpiece from the said orientation to another said orientation on an associated carrier, and the further step of loading on the same carrier a second associated type workpiece in the said orientation thereon, so that the carrier holds the second workpiece in the said orientation and the first workpiece in the another orientation thereon, and the repeating of the steps sufficiently to complete at least one further cycle in which the type and orientation of each said workpiece are sensed and work is performed on both said workpieces in dependence upon such sensing.

* * * * *